(12) United States Patent
Pagaila et al.

(10) Patent No.: US 8,227,910 B2
(45) Date of Patent: Jul. 24, 2012

(54) APPARATUS FOR THERMALLY ENHANCED SEMICONDUCTOR PACKAGE

(75) Inventors: Reza A. Pagaila, Singapore (SG); Byung Tai Do, Singapore (SG); Zigmund R. Camacho, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/212,986

(22) Filed: Aug. 18, 2011

(65) Prior Publication Data

US 2011/0298120 A1    Dec. 8, 2011

Related U.S. Application Data

(62) Division of application No. 12/135,830, filed on Jun. 9, 2008, now Pat. No. 8,021,907.

(51) Int. Cl.
*H01L 23/04* (2006.01)

(52) U.S. Cl. ............. 257/698; 257/774; 257/E23.08

(58) Field of Classification Search .......... 257/698
See application file for complete search history.

(56) References Cited

U.S. PATENT DOCUMENTS

| | | | | |
|---|---|---|---|---|
| 6,836,025 B2 * | 12/2004 | Fujisawa et al. | ............... | 257/782 |
| 7,170,152 B2 | 1/2007 | Huang et al. | | |
| 7,294,920 B2 * | 11/2007 | Chen et al. | ............... | 257/698 |
| 7,750,452 B2 | 7/2010 | Do et al. | | |
| 8,072,079 B2 * | 12/2011 | Pagaila et al. | ............... | 257/774 |
| 8,080,882 B2 * | 12/2011 | Do et al. | ............... | 257/774 |
| 2005/0062173 A1 | 3/2005 | Vu et al. | | |
| 2007/0178622 A1 | 8/2007 | Liu et al. | | |
| 2008/0001283 A1 | 1/2008 | Lee et al. | | |
| 2008/0029870 A1 * | 2/2008 | Chen et al. | ............... | 257/686 |
| 2008/0057624 A1 | 3/2008 | Lee | | |
| 2008/0237888 A1 | 10/2008 | Hayasaka et al. | | |
| 2008/0272368 A1 * | 11/2008 | Do et al. | ............... | 257/40 |
| 2008/0272464 A1 * | 11/2008 | Do et al. | ............... | 257/620 |
| 2008/0272470 A1 * | 11/2008 | Do et al. | ............... | 257/666 |
| 2008/0280394 A1 | 11/2008 | Murtuza et al. | | |
| 2009/0008762 A1 | 1/2009 | Jung | | |
| 2009/0026601 A1 | 1/2009 | Otremba et al. | | |
| 2009/0137086 A1 | 5/2009 | Otremba et al. | | |
| 2009/0140394 A1 * | 6/2009 | Bathan et al. | ............... | 257/621 |
| 2009/0243045 A1 * | 10/2009 | Pagaila et al. | ............... | 257/621 |
| 2009/0269891 A1 | 10/2009 | Liu et al. | | |
| 2009/0294899 A1 * | 12/2009 | Pagaila et al. | ............... | 257/528 |
| 2010/0044885 A1 | 2/2010 | Fuergut et al. | | |
| 2010/0096731 A1 * | 4/2010 | Do et al. | ............... | 257/620 |
| 2010/0140799 A1 * | 6/2010 | Do et al. | ............... | 257/737 |
| 2010/0172113 A1 | 7/2010 | Lam | | |

(Continued)

*Primary Examiner* — N Drew Richards
*Assistant Examiner* — Grant Withers
(74) *Attorney, Agent, or Firm* — Robert D. Atkins; Patent Law Group: Atkins & Associates, P.C.

(57) ABSTRACT

A semiconductor package includes a semiconductor die having contact pads. An encapsulant is disposed around the semiconductor die, and conductive vias are disposed in the encapsulant. Electrically conductive traces are disposed between the contact pads and conductive vias, a thermally conductive channel is disposed in the encapsulant separate from the conductive vias, and a thermally conductive layer is disposed over an area of heat generation of the semiconductor die. A thermally conductive trace is disposed between the thermally conductive layer and thermally conductive channel. The thermally conductive layer, thermally conductive trace, and thermally conductive channel are electrically isolated from the contact pads of the semiconductor die and the electrically conductive traces. The semiconductor package further comprises broad thermal traces disposed over the encapsulant, and a thermally conductive material interconnecting the broad thermal traces and the thermally conductive layer.

22 Claims, 32 Drawing Sheets

U.S. PATENT DOCUMENTS

2010/0213618 A1* 8/2010 Pagaila et al. ............. 257/774
2010/0233852 A1   9/2010 Do et al.
2011/0084402 A1* 4/2011 Jeung et al. ............... 257/774
2011/0124156 A1* 5/2011 Do et al. ................... 438/107
2012/0018900 A1* 1/2012 Pagaila et al. ............. 257/774
2012/0034777 A1* 2/2012 Pagaila et al. ............. 438/667
2012/0056316 A1* 3/2012 Pagaila et al. ............. 257/737
2012/0056321 A1* 3/2012 Pagaila ..................... 257/737
2012/0056329 A1* 3/2012 Pagaila et al. ............. 257/774

* cited by examiner

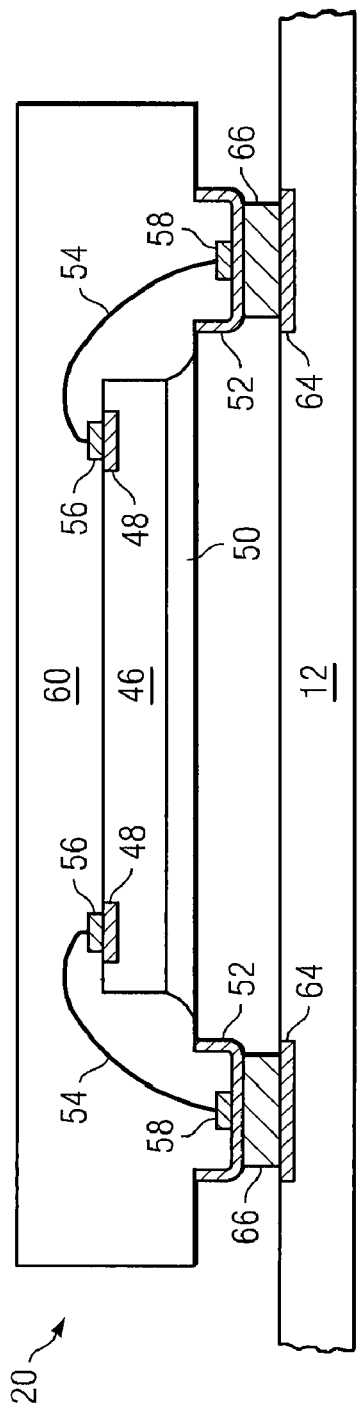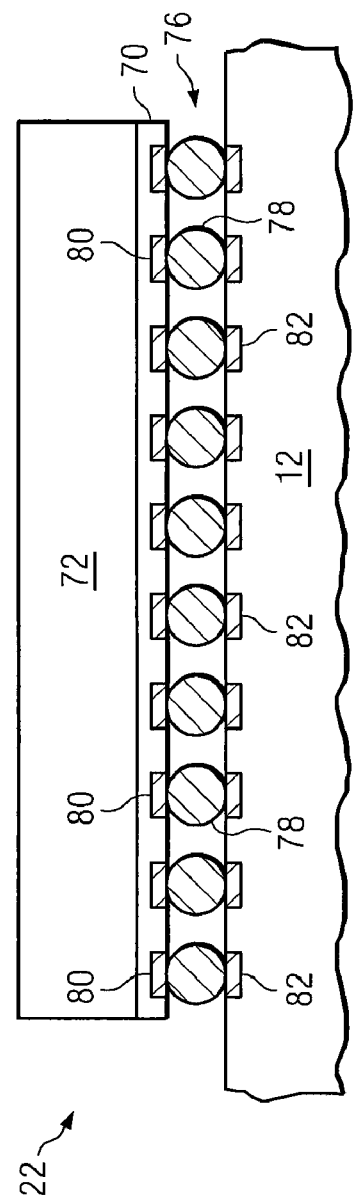

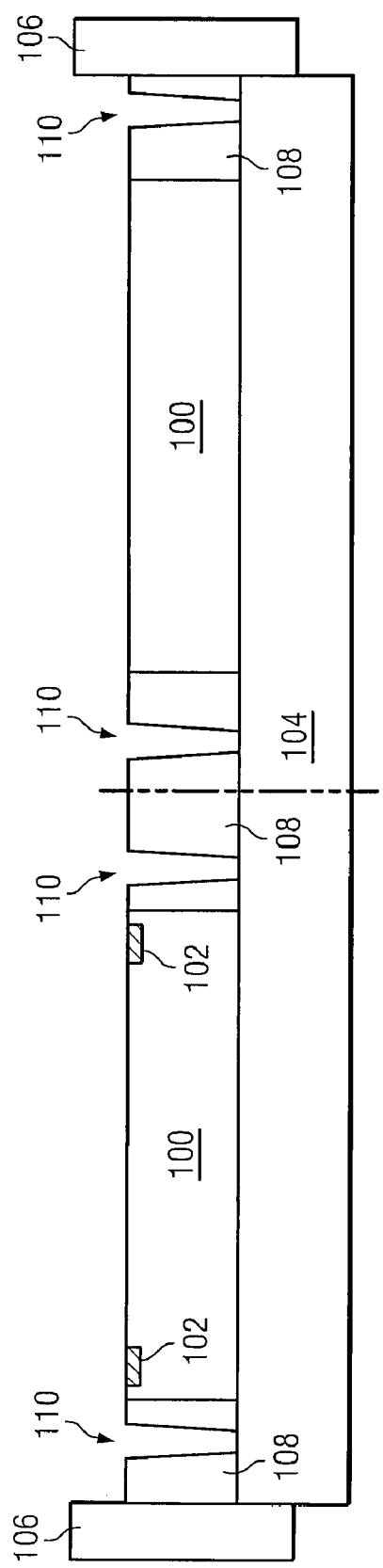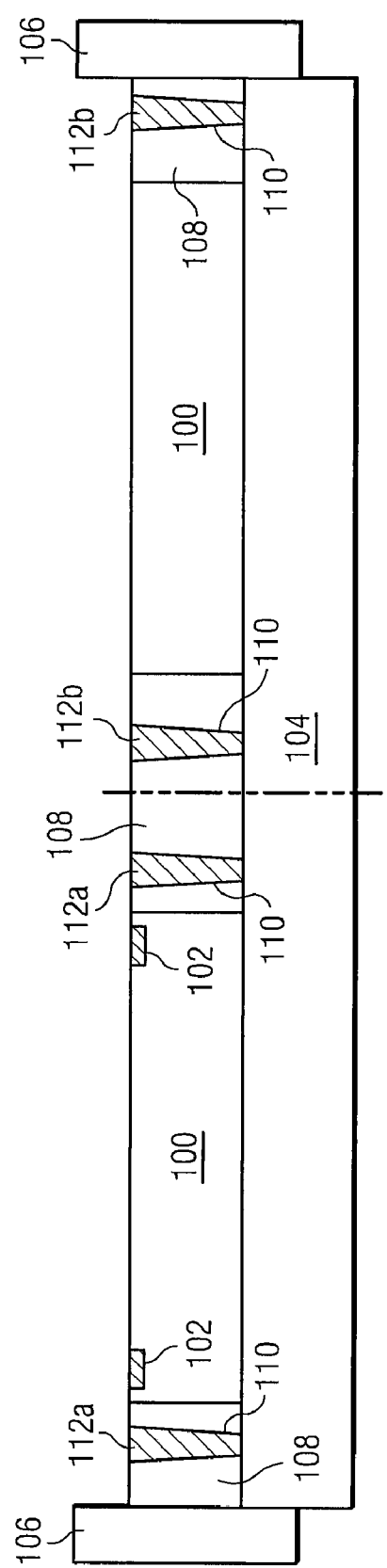

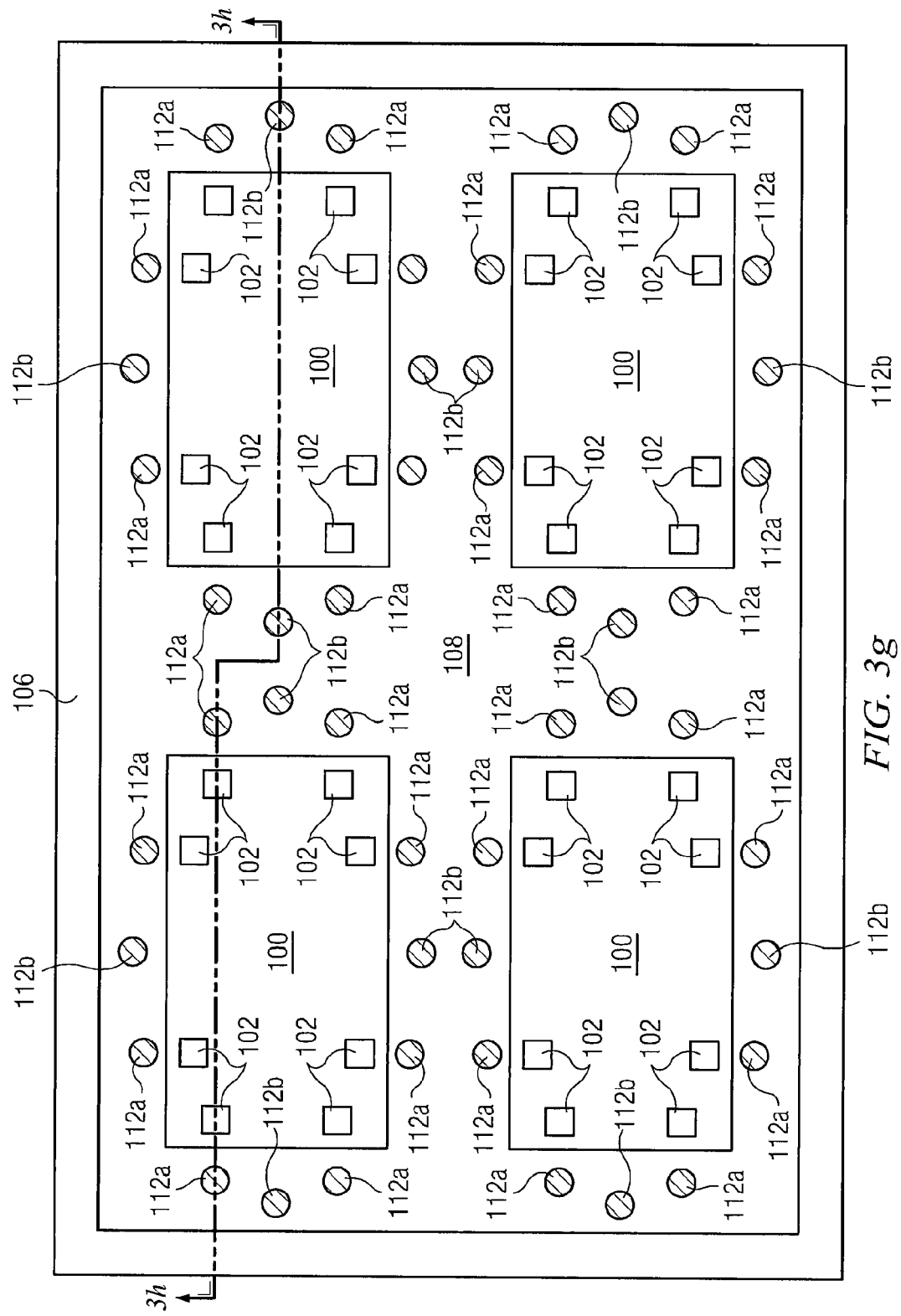

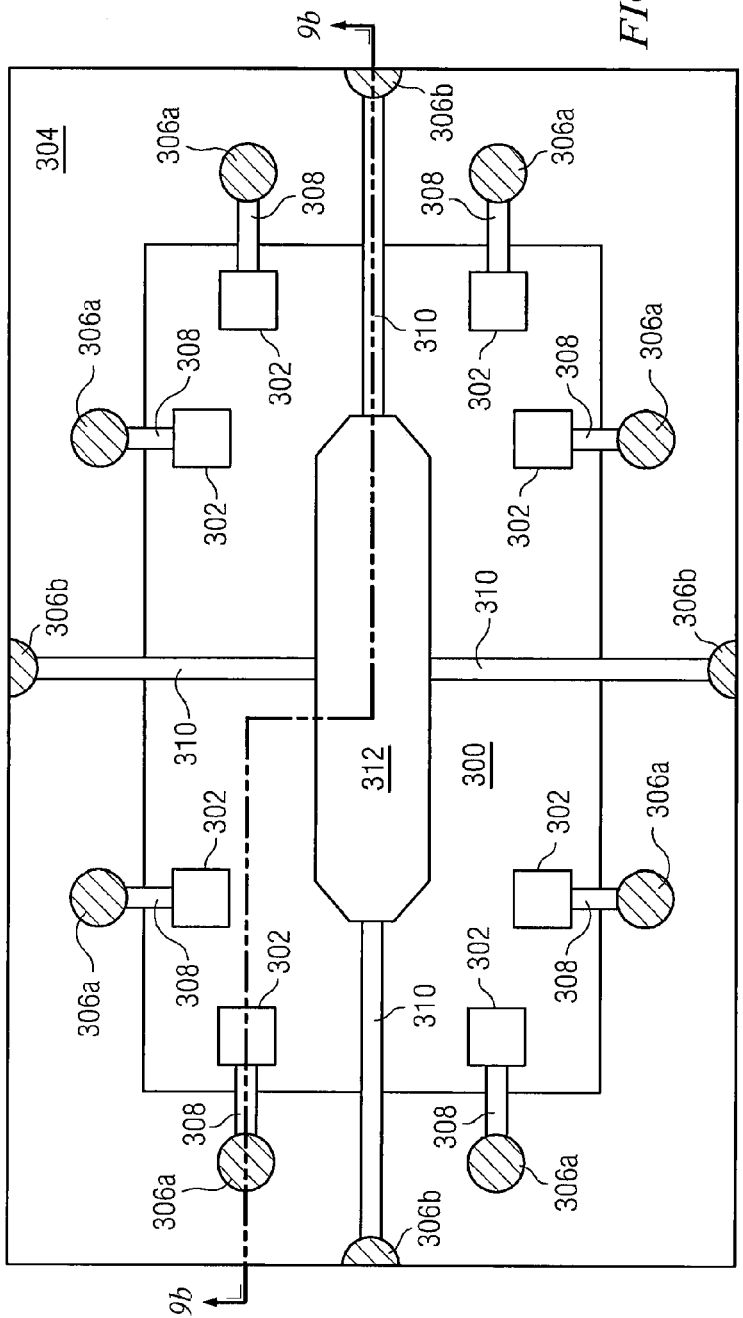
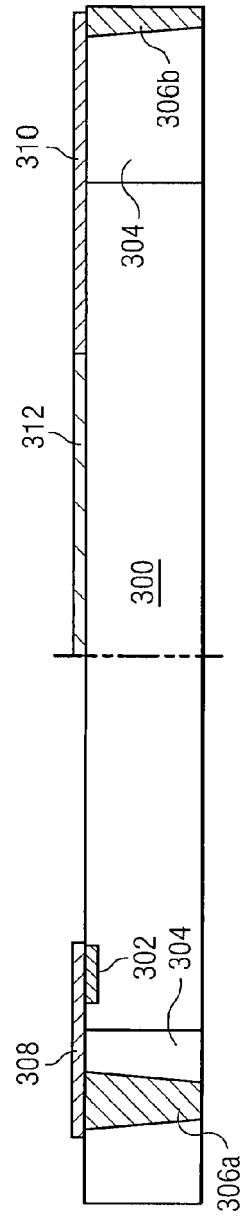
FIG. 9a
FIG. 9b

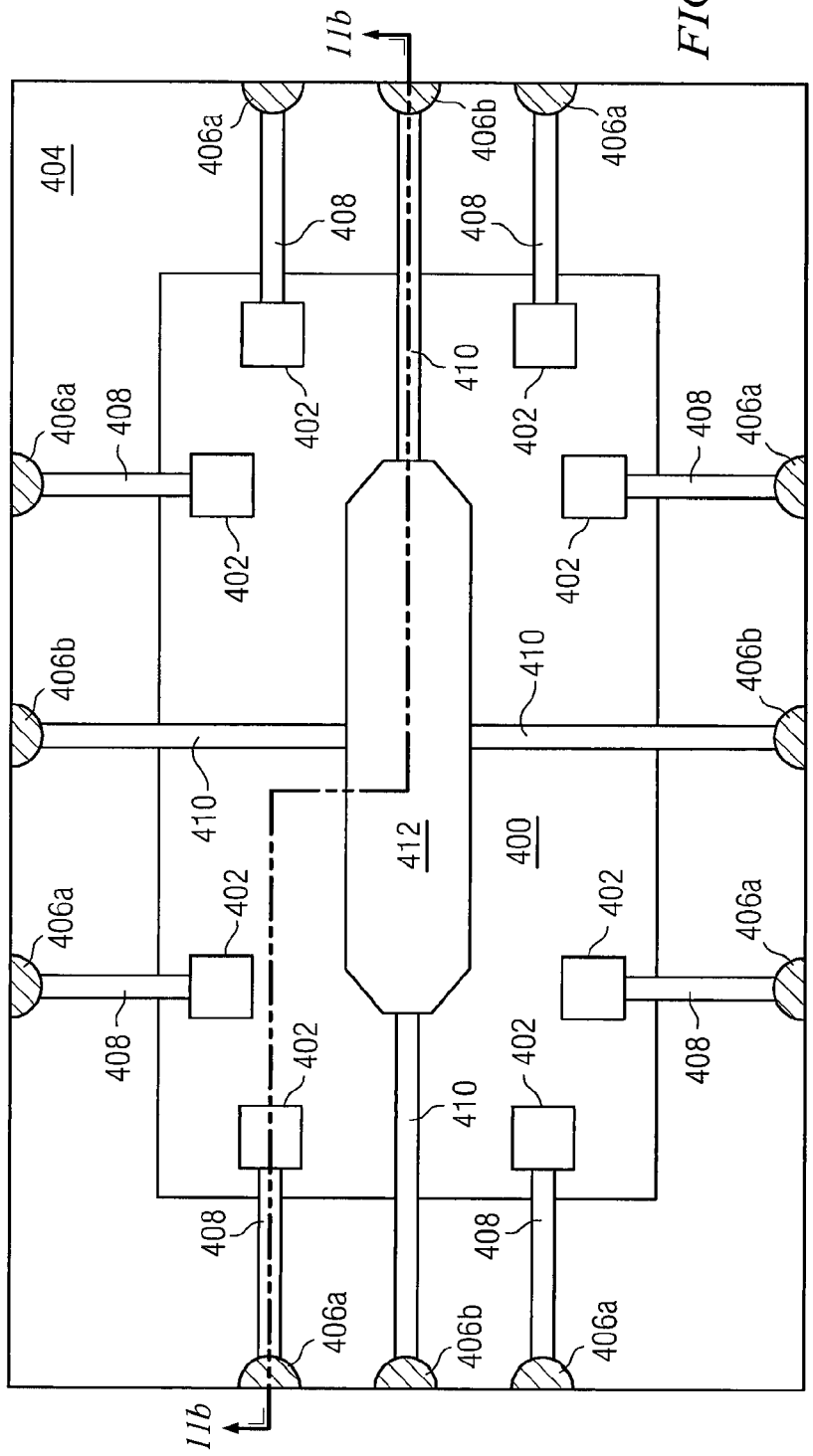
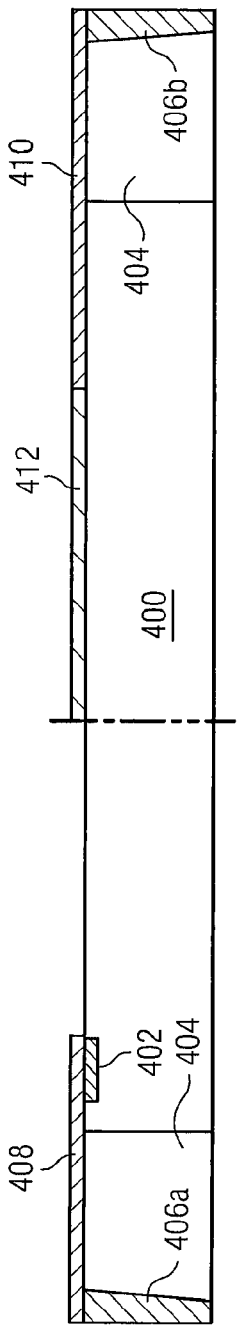
FIG. 11a
FIG. 11b

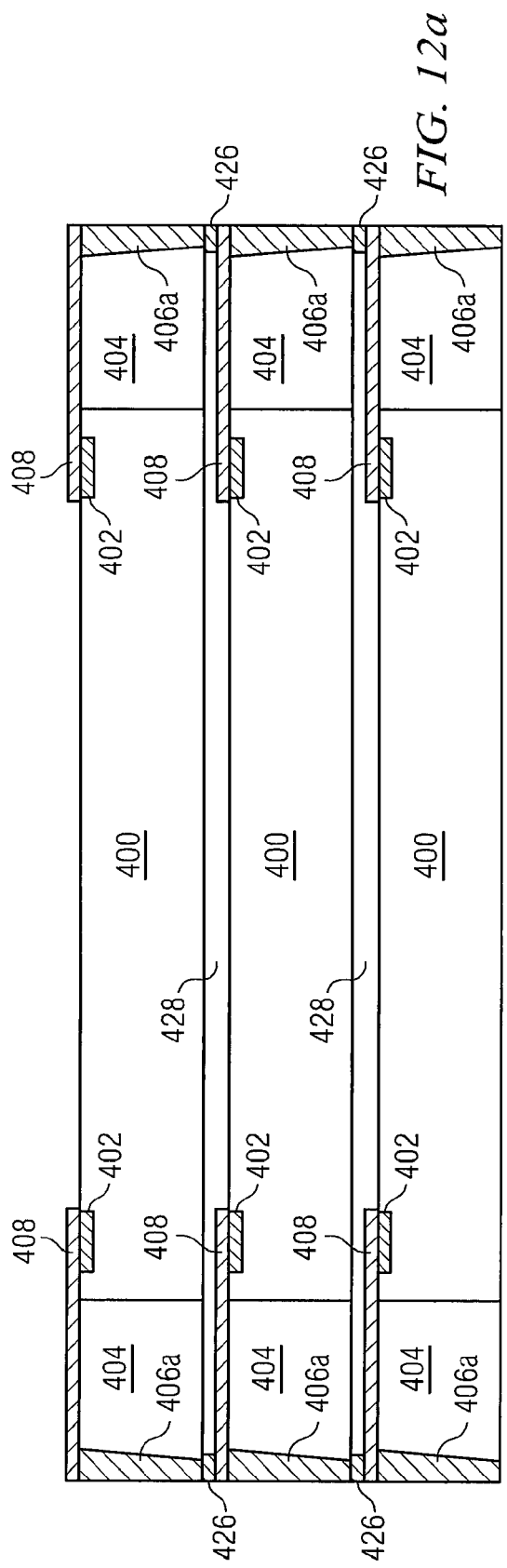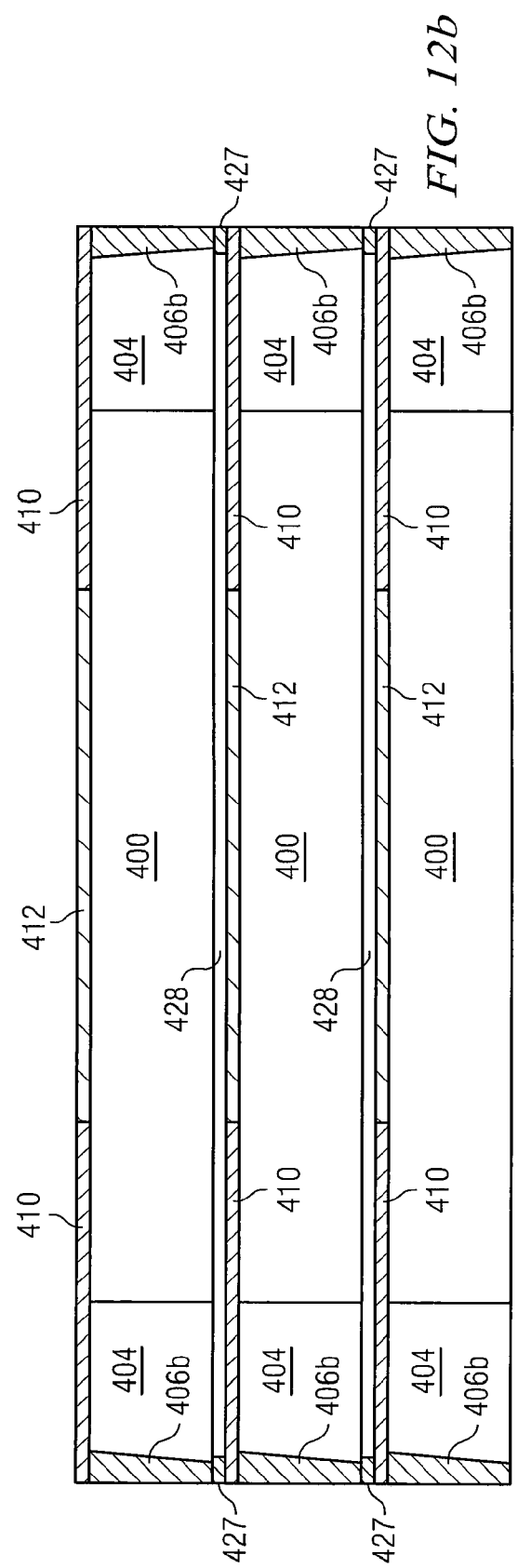

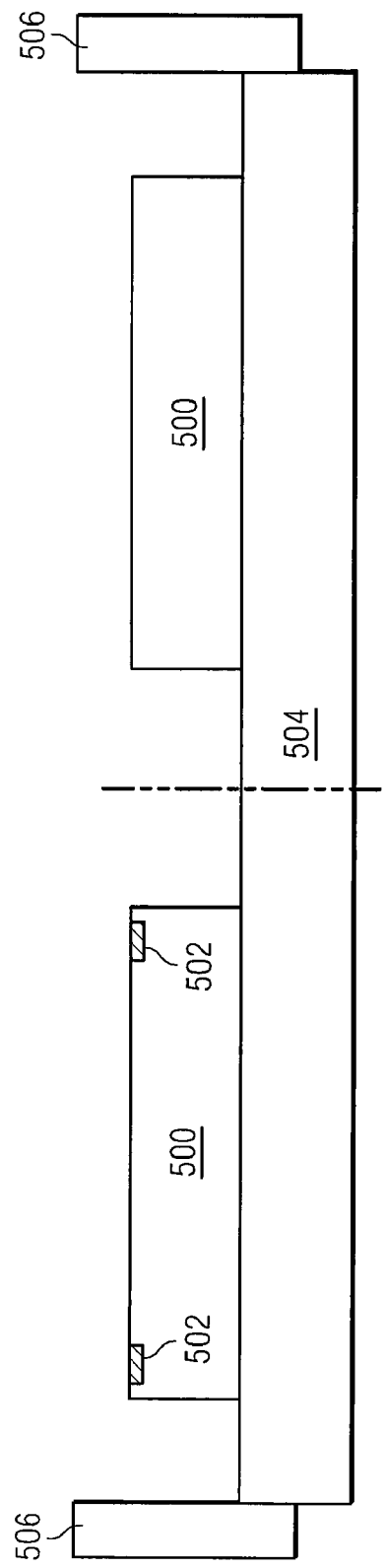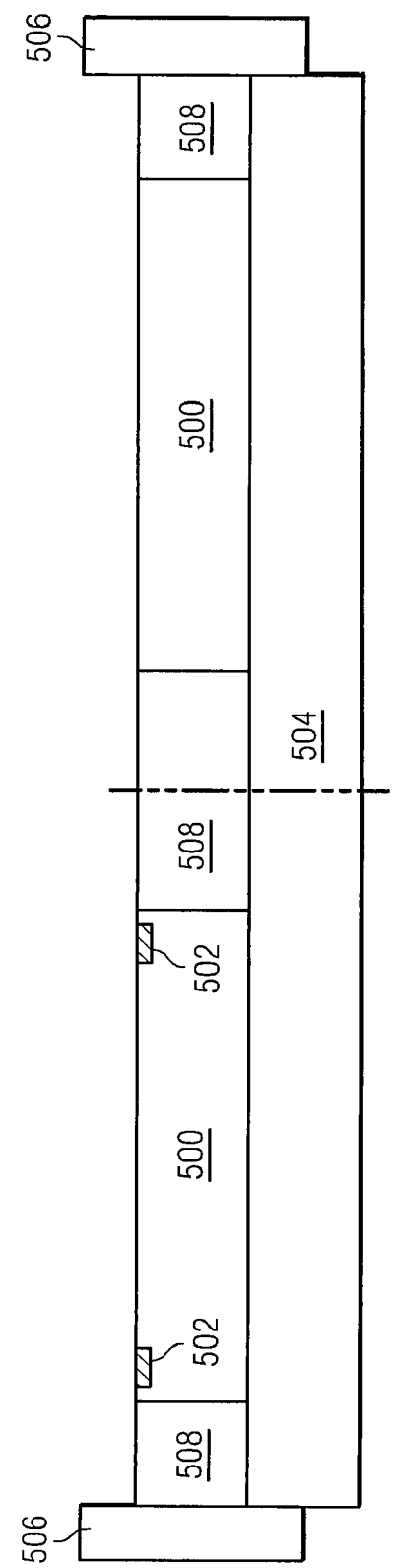

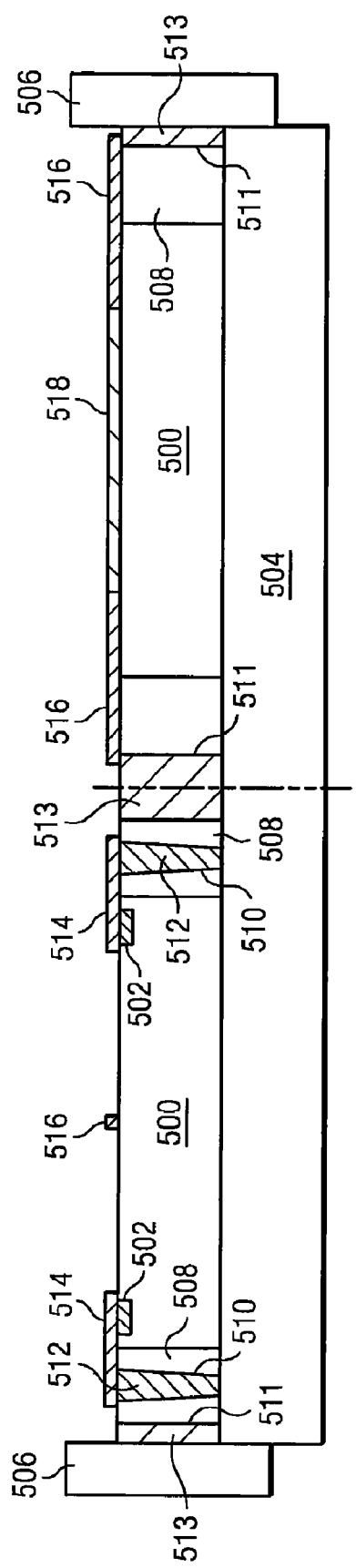
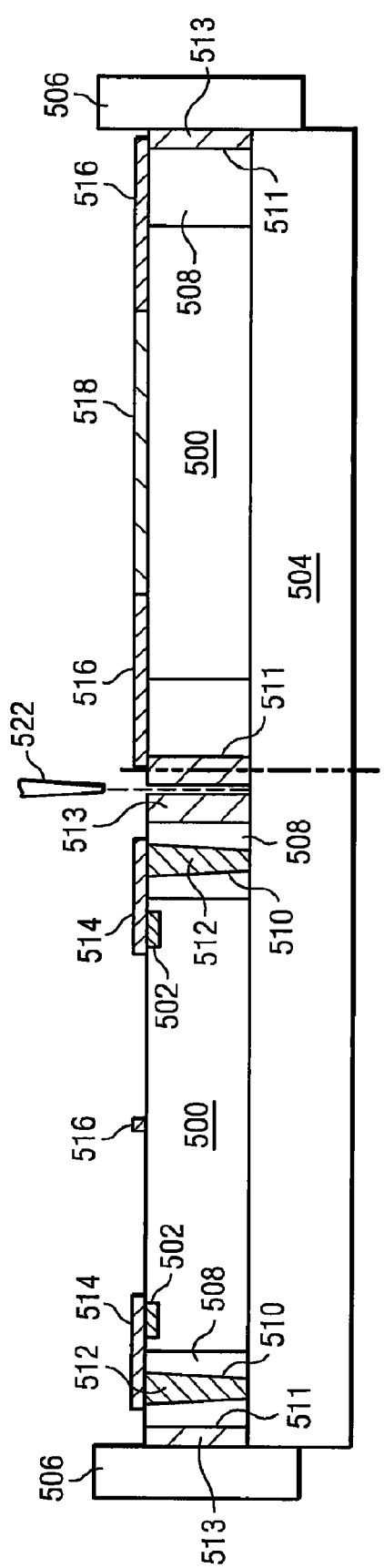
FIG. 13j
FIG. 13l

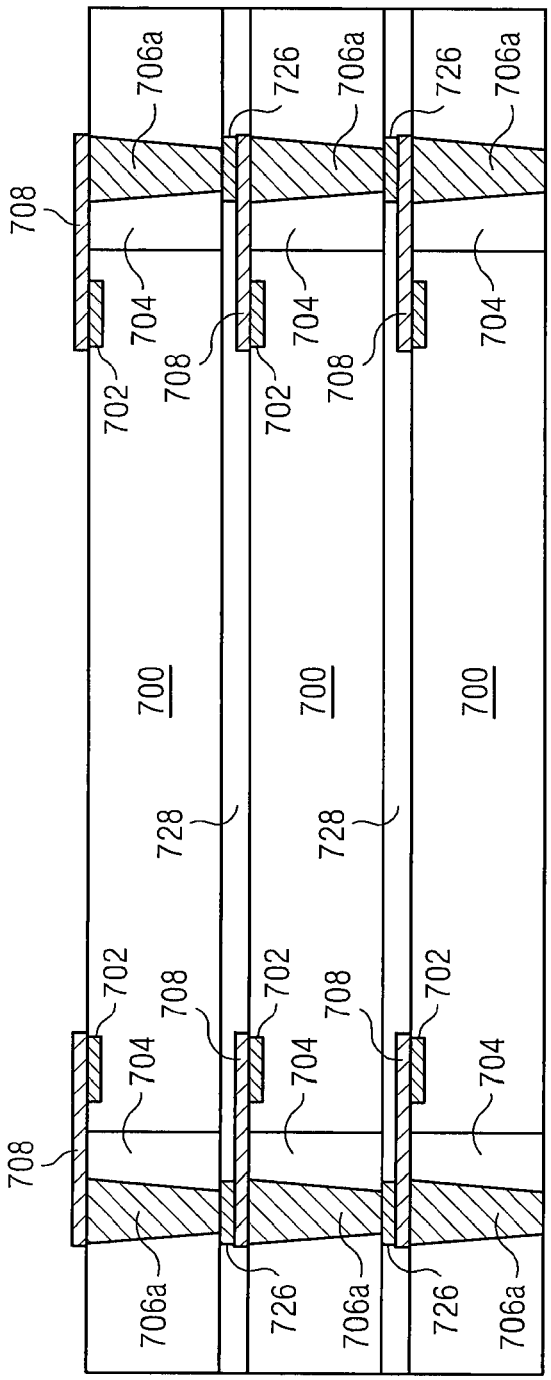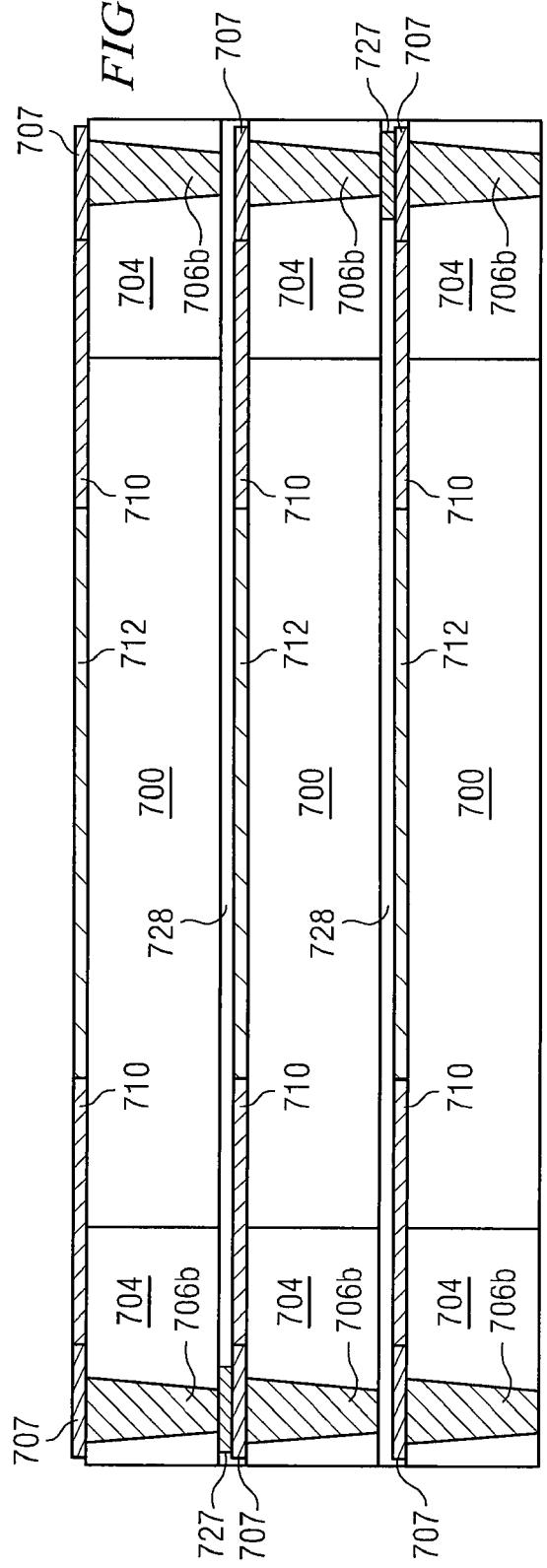

APPARATUS FOR THERMALLY ENHANCED SEMICONDUCTOR PACKAGE

CLAIM TO DOMESTIC PRIORITY

The present application is a division of U.S. patent application Ser. No. 12/135,830, filed Jun. 9, 2008, and claims priority to the foregoing parent application pursuant to 35 U.S.C. §120.

FIELD OF THE INVENTION

The present invention relates in general to semiconductor devices and, more particularly, to a thermally enhanced wafer level package having through vias or peripheral channels formed around an encapsulated semiconductor die.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

Semiconductor devices operate by exploiting the electrical properties of semiconductor materials. Generally, semiconductor materials have electrical properties that vary between those of conductors and insulators. In most cases, semiconductors have poor electrical conductivity, however their conductivity can be modified through the use of doping and/or applied electrical fields. Doping involves introducing impurities into the semiconductor material to adjust its electrical properties. Depending on the amount of doping performed, semiconductor materials may be permanently modified to conduct electricity as well as other conductors or to act as insulators. The application of electric fields also modifies the conductivity of semiconductor materials by modifying the distribution of conductive particles within the material. Through doping and the application of electronic fields, electronic devices and integrated circuits are formed and operated over a semiconductor substrate. The devices and circuits include multiple layers of semiconductor, insulator and conductive materials.

Because the electrical properties of semiconductor materials may be altered by the application of electric fields, they can be used to manufacture both passive and active circuit elements. Passive devices include capacitors, inductors, resistors and other devices that are not capable of power gain. Active devices, however, include transistors and allow for the creation of circuits that can both amplify and switch electrical signals. Transistors are the fundamental elements of modern computing systems and allow for the formation of logic circuits that include complex functionality and provide high performance.

Many transistors can be combined into a single integrated circuit formed over a semiconductor wafer or substrate. Integrated circuits combine many transistors and other passive and active devices over a single substrate to provide complex electronic circuits such as processors, microcontrollers, digital signal processors, and memory systems. Modern integrated circuits may include tens of millions of transistors and provide the complex functionality of all computing systems. Integrated circuits and other semiconductor devices in electronic systems provide high performance in a small area and may be created using cost-efficient manufacturing processes.

The manufacture of semiconductor devices and integrated circuits involves formation of a wafer having a plurality of die. Each semiconductor die contains transistors and other active and passive devices performing a variety of electrical functions. For a given wafer, each die from the wafer typically performs the same electrical function. Semiconductor devices are formed in two steps referred to as front-end and back-end manufacturing that involve formation of the die and packaging for an end user.

Front-end manufacturing generally refers to formation of the semiconductor devices on the wafer. During formation of the devices, layers of a dielectric material such as silicon dioxide are deposited over the wafer. The dielectric facilitates the formation of transistors and memory devices. Metal layers are deposited over the wafer and patterned to interconnect the various semiconductor devices. The finished wafer has an active side containing the transistors and other active and passive components. After the devices are formed, they are tested in a preliminary testing step to verify the devices are operational. If a sufficiently high number of devices are discovered to contain defects, the devices or even the entire wafer may be discarded.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. In some cases, the wafer is singulated using a laser cutting device. After singulation, the individual dies are mounted to a package substrate that includes pins or contact pads for interconnection with other system components. Contact pads formed over the semiconductor die are then connected to contact pads within the package. Often, wire bonding is used to make the connection, however other connection technologies such as solder bumps or stud bumping may be used. After wire bonding, an encapsulant or other molding material is deposited over the package to provide physical support and electrical insulation. The finished package is then inserted into an electrical system and the functionality of the semiconductor device is made available to the other system components.

One goal of semiconductor manufacturing is to produce a package suitable for faster, reliable, smaller, and higher-density integrated circuits at lower cost. Flip chip packages or wafer level packages are ideally suited for integrated circuits demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation distance, lower capacitance, and achieve overall better circuit performance.

In many applications, it is desirable to configure the wafer level or chip scale package to minimize heat build-up within the encapsulated semiconductor die or other components of the package. However, because many packages include a plurality of die or chips that are stacked over one another, heat is captured between the die within the package. To remove heat from the package, thermal vias may be formed within the peripheral encapsulating organic material. However, the organic material does not generally provide efficient thermal conduction. As a result, heat continues to build-up within the package and may cause malfunctions to occur within the semiconductor die.

SUMMARY OF THE INVENTION

In one embodiment, the present invention is a semiconductor package a semiconductor die having contact pads. An encapsulant is disposed around the semiconductor die, and a plurality of conductive vias is disposed in the encapsulant. A plurality of electrically conductive traces is disposed between the contact pads and conductive vias, a thermally conductive channel is disposed in the encapsulant separate from the conductive vias, and a thermally conductive layer is disposed over an area of heat generation of the semiconductor die. A thermally conductive trace is disposed between the thermally conductive layer and thermally conductive channel. The thermally conductive layer, thermally conductive trace, and thermally conductive channel are electrically isolated from the contact pads of the semiconductor die and the electrically conductive traces.

In another embodiment, the present invention is a semiconductor package comprising a semiconductor die having a contact pad. An encapsulant is disposed around the semiconductor die, and first and second conductive vias are disposed in the encapsulant. An electrically conductive trace is disposed between the contact pad and first conductive via, and a thermally conductive layer is disposed over an area of heat generation of the semiconductor die. A first thermally conductive trace is disposed over the semiconductor die between the thermally conductive layer and second conductive via.

In another embodiment, the present invention is a semiconductor package comprising a semiconductor die having a contact pad, an encapsulant disposed around a portion of the semiconductor die, and a conductive via disposed in the encapsulant. An electrically conductive trace is disposed between the contact pad and the conductive via, a thermally conductive structure is disposed in the encapsulant, and a thermally conductive layer is disposed over the semiconductor die. A thermally conductive trace is disposed between the thermally conductive structure and the thermally conductive layer. The thermally conductive layer, the thermally conductive trace, and the thermally conductive structure are electrically isolated from the contact pad of the semiconductor die and the electrically conductive trace.

In another embodiment, the present invention is a semiconductor package comprising a semiconductor die having a contact pad, an encapsulant disposed around the semiconductor die, and a trench etched into the encapsulant around a portion of the semiconductor die. A thermally conductive material is disposed in the trench to form a thermal channel, and a thermally conductive pad is disposed over the semiconductor die. Thermally conductive traces interconnect the thermal channel and the thermally conductive pad.

BRIEF DESCRIPTION OF THE DRAWINGS

FIGS. 2*a*-2*d* illustrate further detail of the semiconductor packages mounted to the PCB;

FIGS. 3*a*-3*l* illustrate a process of manufacturing an integrated circuit (IC) package having thermally enhanced through vias formed in a staggered dual-row configuration;

FIGS. 9*a* and 9*b* illustrate an IC or semiconductor die package having a staggered dual row via configuration with exposed thermal vias;

FIGS. 11*a* and 11*b* illustrate an IC or semiconductor die package having a single row of exposed signal and thermal vias;

FIGS. 12*a* and 12*b* illustrate cross-sectional views of a package including a plurality of stacked chip packages having single rows of alternating signal and thermal vias;

FIGS. 13*a*-13*l* illustrate a process of manufacturing an IC package having a peripheral thermal channel and conductive signal vias;

FIGS. 17*a* and 17*b* illustrate cross-sectional views of a package including a plurality of stacked chip packages having thermal interconnections formed on alternating sides of the package.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
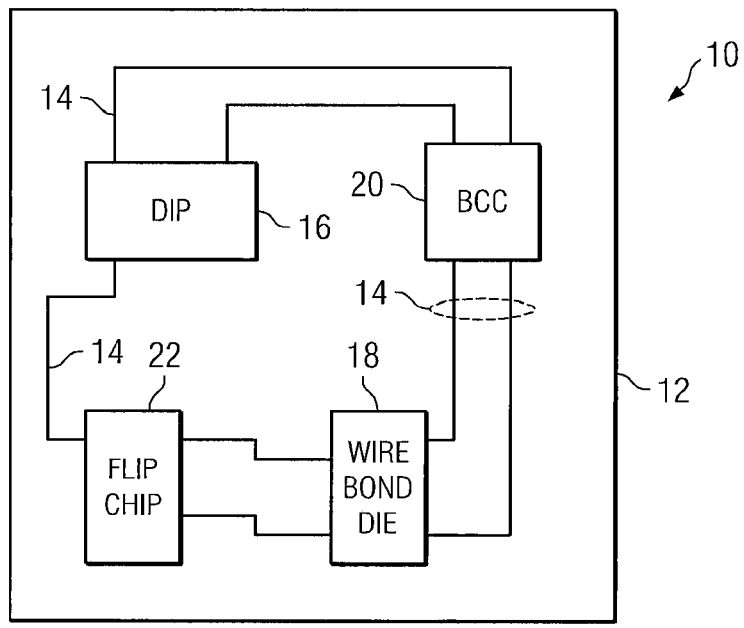
FIG. 1 illustrates a printed circuit board (PCB) with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
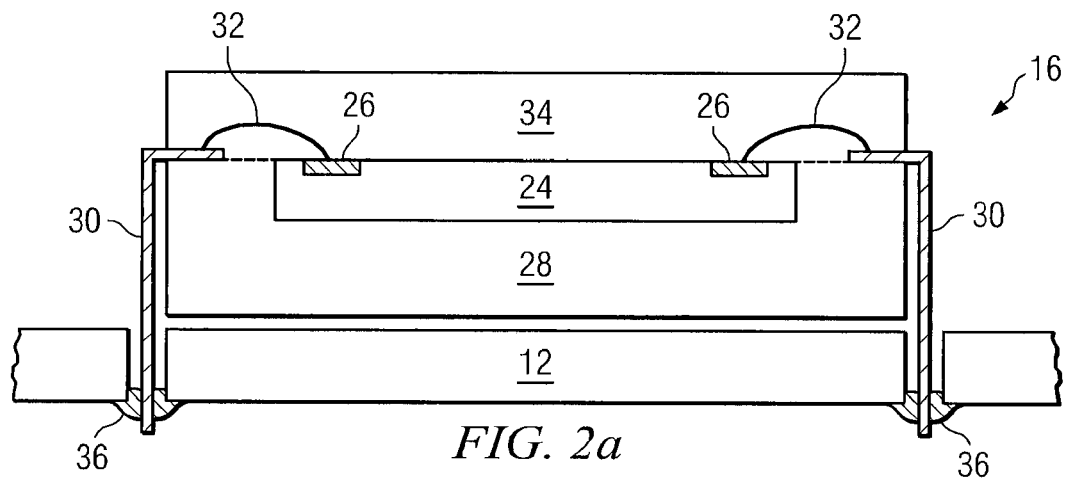

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. Encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
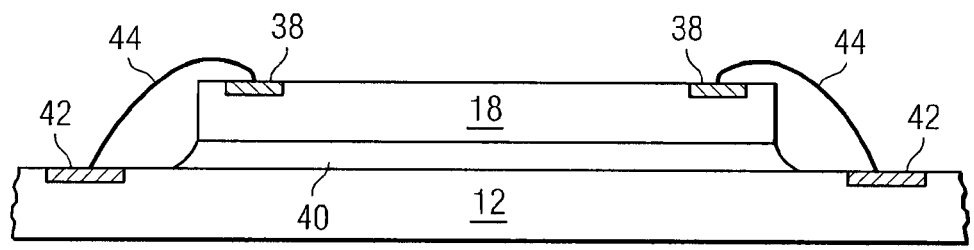

Referring to FIG. 2b, a wire bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
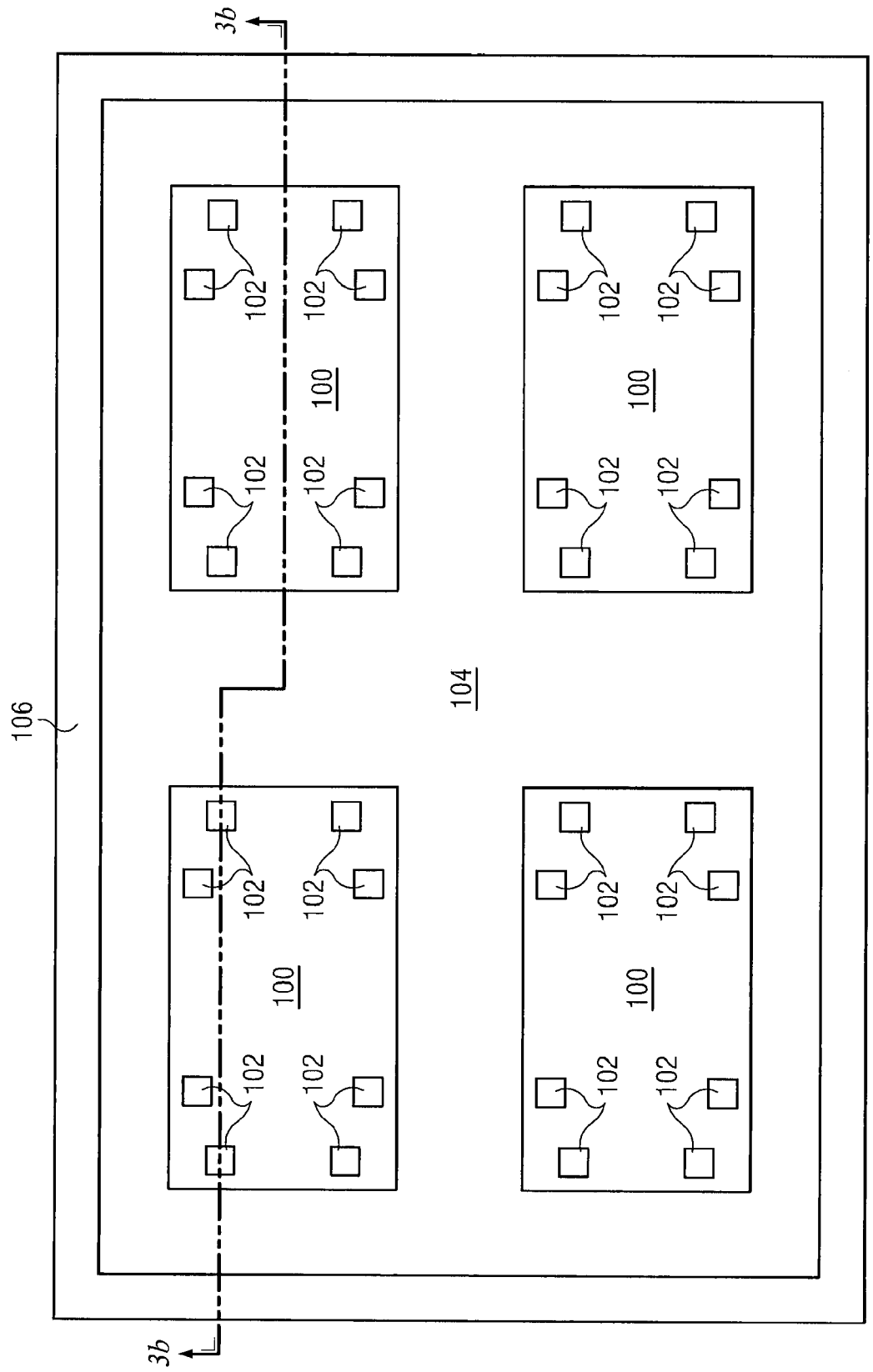
Figure 3B:
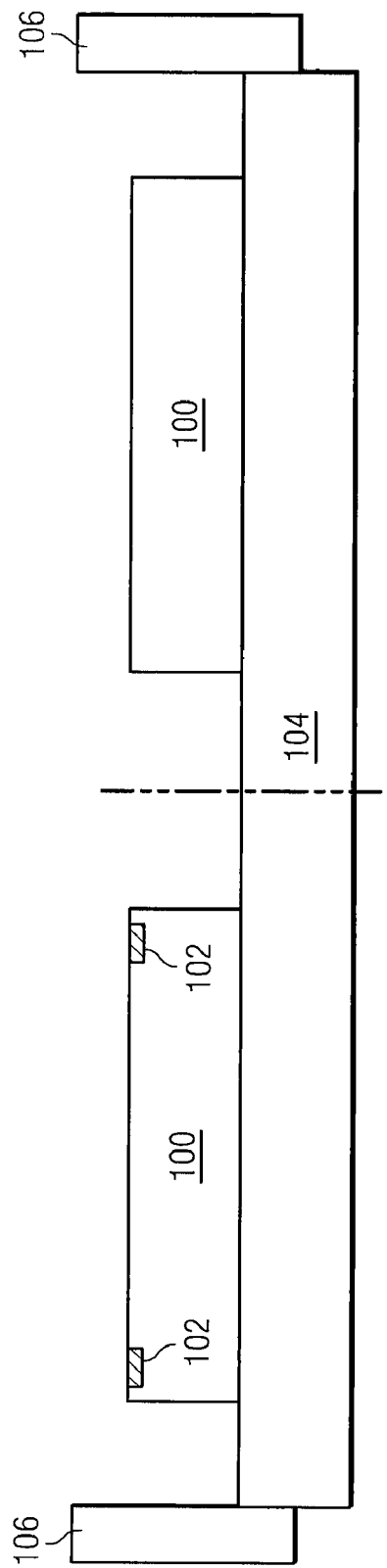

FIGS. 3a-3l illustrate a process of manufacturing an IC package having thermally enhanced through vias formed in a staggered dual-row configuration. Referring to FIG. 3a, semiconductor dies 100 are mounted to chip carrier 104. Dies or chips 100 include semiconductor dies such as memory, controllers, application specific integrated circuits (ASICs), processors, microcontrollers, or combinations thereof. Contact pads 102 include a conductive material such as Cu, Ag, or Au and are formed over a surface of dies 100 by a PVD, CVD, electrolytic plating, or electroless plating process. An optional adhesive (not shown) may be used to fix dies 100 to carrier 104. In one embodiment, the adhesive includes a thermal epoxy adhesive material. Carrier 104 includes any substrate, apparatus or other structure suitable for mounting a plurality of semiconductor die or other electronic components. Carrier 104 may be expandable for creating and/or expanding gaps between each of the semiconductor die or other electronic components. Carrier 104 includes carrier walls 106 which are formed around a perimeter of carrier 104. FIG. 3b illustrates a cross-sectional view of FIG. 3a taken along section plane 3b. Dies 100 are mounted over carrier 104. An optional adhesive may be used to bond dies 100 to carrier 104.

Figure 3D:
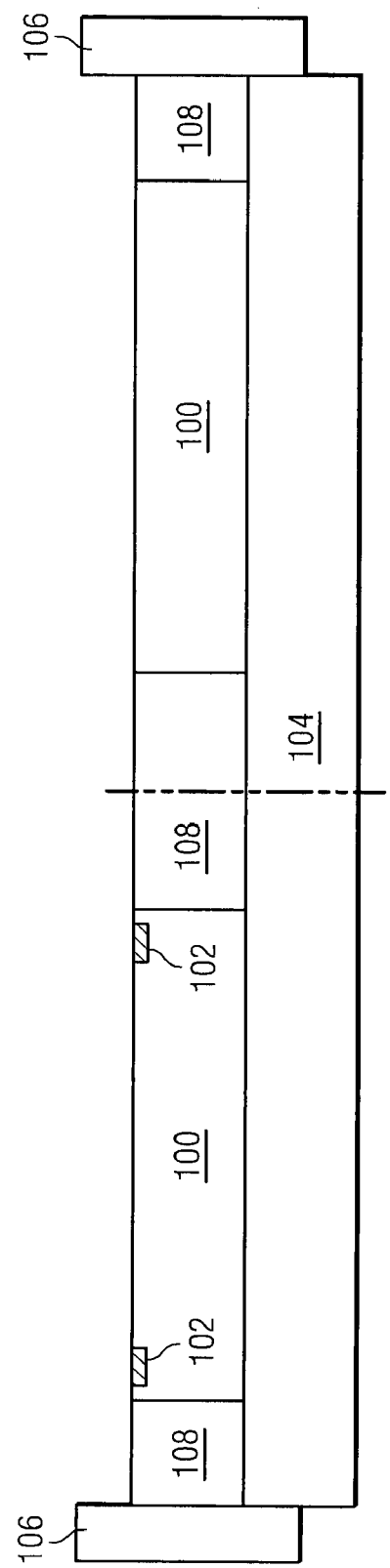
Figure 3C:
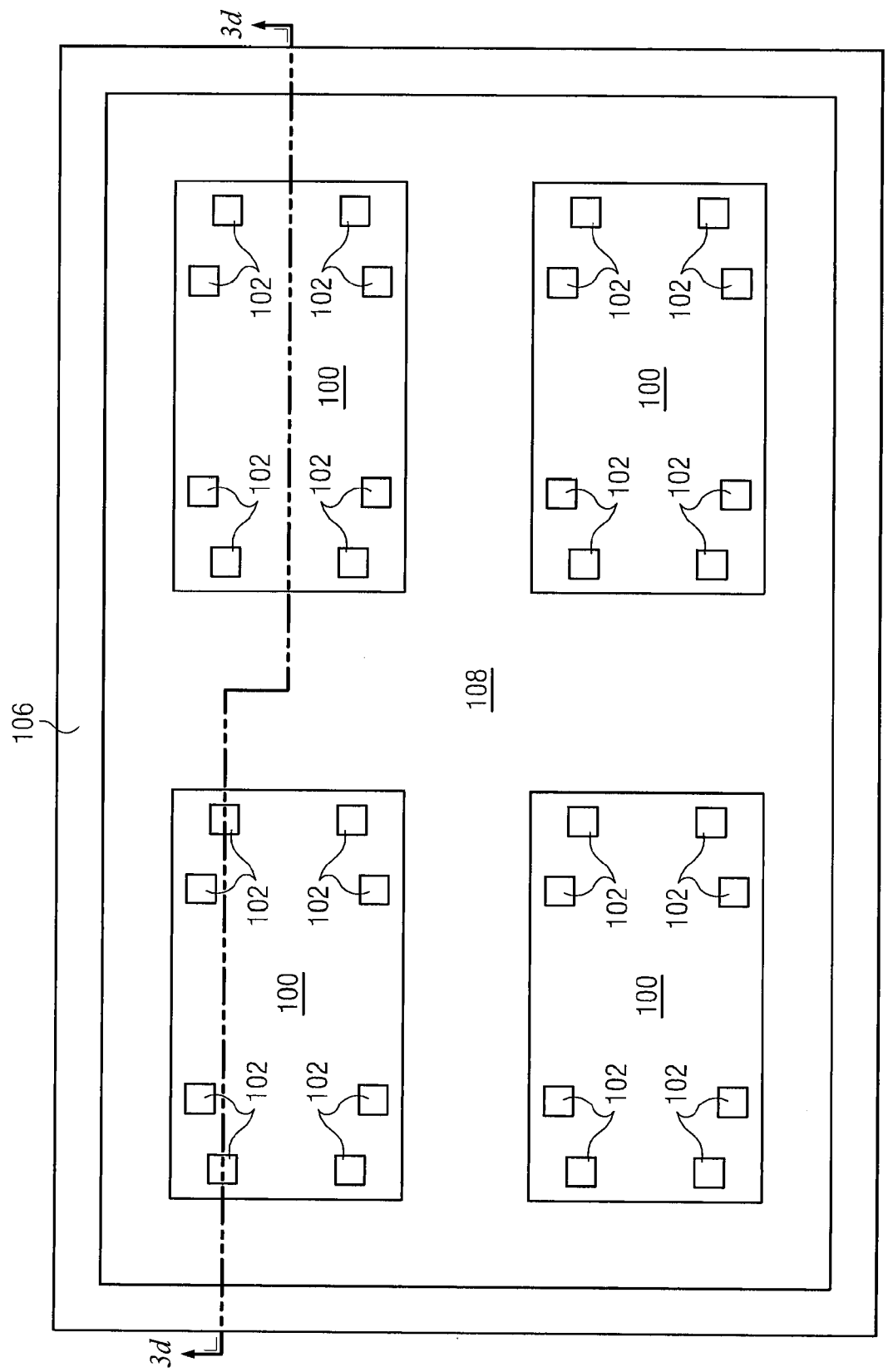

Turning to FIG. 3c, encapsulant 108 is deposited over carrier 104 around dies 100. Encapsulant 108 includes mold compound, or other organic insulating materials. Encapsulant 108 is deposited using spin coating, needle dispensing, or other suitable application processes. Encapsulant 108 may further include a filler material to assist in matching the coefficient of thermal expansion (CTE) of the package to encapsulant 108. A top surface of encapsulant 108 is approximately coplanar with a top surface of dies 100. Carrier walls 106 control the flow of encapsulant 108. FIG. 3d illustrates a cross-sectional view of the package taken along section plane 3d of FIG. 3c. As shown in FIG. 3d, encapsulant 108 is deposited around each of dies 100 mounted over carrier 104. Capillary action may be relied upon to cause encapsulant 108 to flow around and fill any gaps formed between dies 100.

Figure 3E:
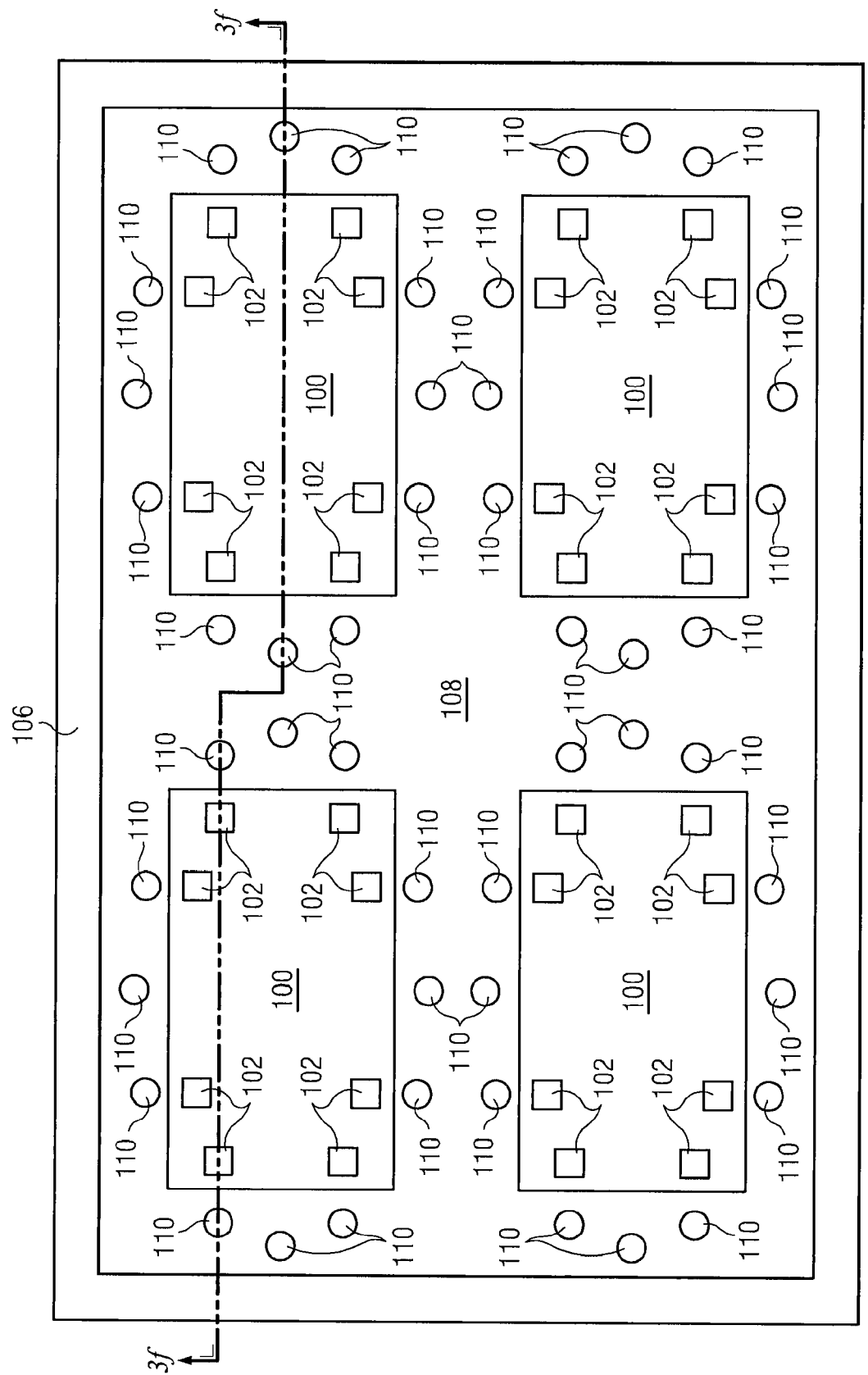

Turning to FIG. 3e, encapsulant 108 is etched. A laser drilling or other etching process is used to form vias 110 in encapsulant 108. Vias 110 are configured in two rows of staggered vias formed around each of dies 100. In other embodiments, vias 110 may be formed in any number of rows having staggered or other placement configurations. Some vias 110 operate as signal vias, whereas other vias operate as thermal vias. FIG. 3f shows a cross-sectional view of the package taken along section plane 3f of FIG. 3e. As shown in FIG. 3f, vias 110 are generally shaped as conical frustums, however vias 110 may have any suitable shape.

Turning to FIG. 3g, conductive material is deposited into vias 110 to form signal vias 112a and thermal vias 112b. The conductive material includes metals such as Cu, Au, Ag, or other thermally and/or electrically conductive material. The conductive material may be deposited using needle dispensing, sputtering or electroplating processes. Before deposition into or filling of vias 110, an optional seed layer may be pre-applied to enhance adhesion between the conductive material and encapsulant 108. FIG. 3h illustrates a cross-sectional view of the fabrication process taken along section plane 3h of FIG. 3g. Signal vias 112a and thermal vias 112b may include different combinations of conductive materials.

Figure 3I:
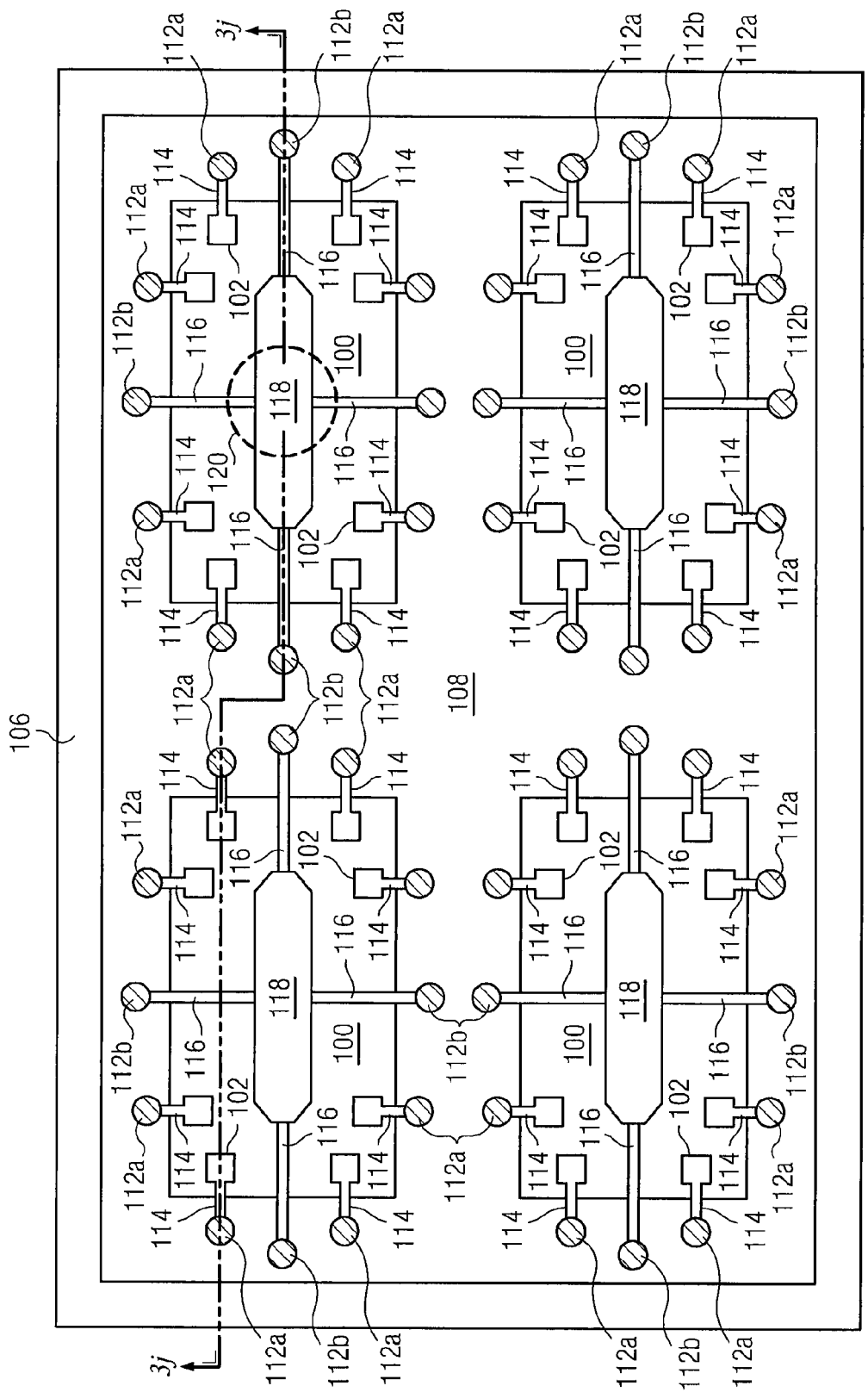
Figure 3J:
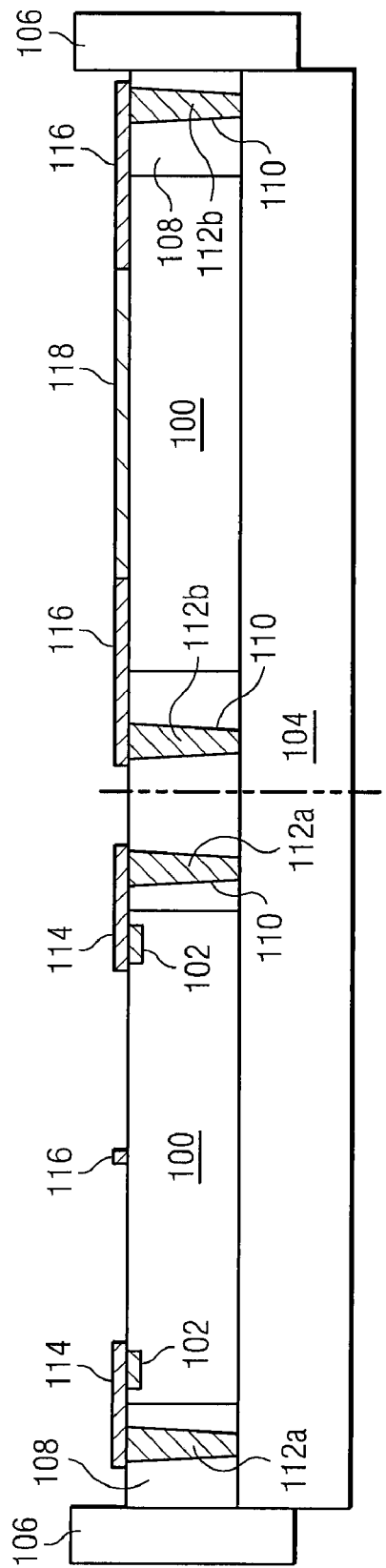

Turning to FIGS. 3i and 3j, a plurality of traces are formed over dies 100 and encapsulant 108. FIG. 3j illustrates a cross-sectional view of the fabrication step taken along plane 3j of FIG. 3i. The traces include an electrically and/or thermally conductive material such as metals including Al, Cu, Sn, Ni, Au, or Ag. The traces may be formed using a photolithography and deposition process. However, other deposition processes such as PVD, CVD, electrolytic plating, or electroless plating may be used. Signal traces 114 are patterned and deposited to form electrical interconnections between contact pads 102 of dies 100 and signal vias 112a. Thermal traces 116 are patterned and deposited between thermal vias 112b and a hot spot of dies 100 including an optional conductive pad 118 (shown on FIG. 3i). Conductive pad 118 includes a thermally conductive material and is patterned and deposited over hot spot areas of dies 100 where a majority of the heat energy generated by dies 100 is formed (hot spot indicated by dashed circle 120). In one embodiment, conductive pad 118 and thermal traces 116 include the same material and are formed during the same patterning and deposition process. Signal traces 114 include an electrically conductive material and carry electronic signals between semiconductor die 100 and signal vias 112a. Thermal traces 116 include a thermally conductive material such as metals and provide a pathway for heat to travel from hot spot 120 of dies 100 through thermal traces 116 and into thermal vias 112b. After being transferred into thermal vias 112b, the heat energy can be removed from the package. Thermal vias 112b do not connect to bond pads 102 of dies 100 and do not carry electrical signals.

Figure 3L:
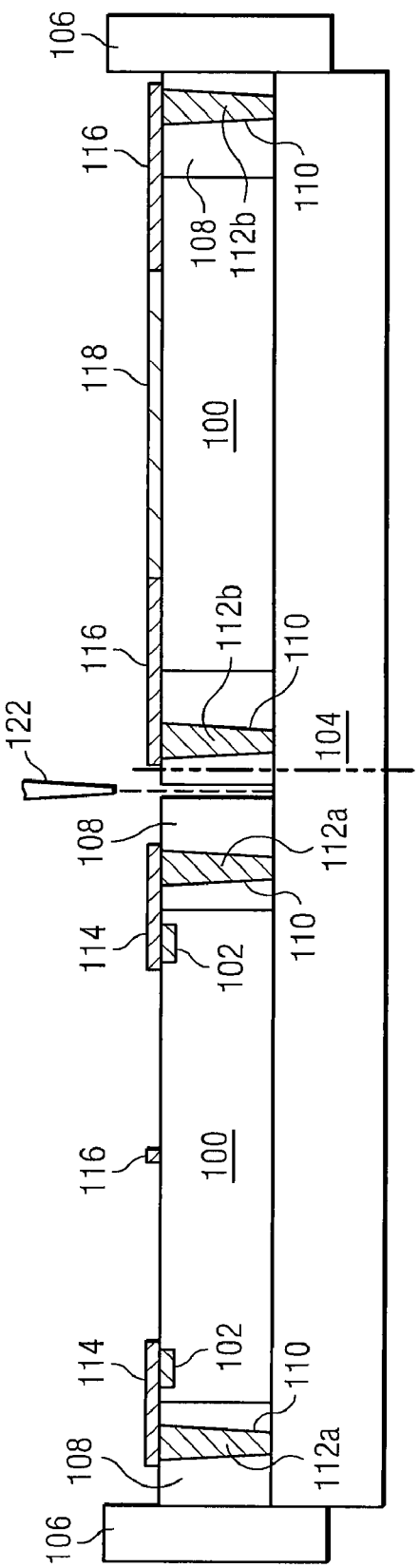
Figure 3K:
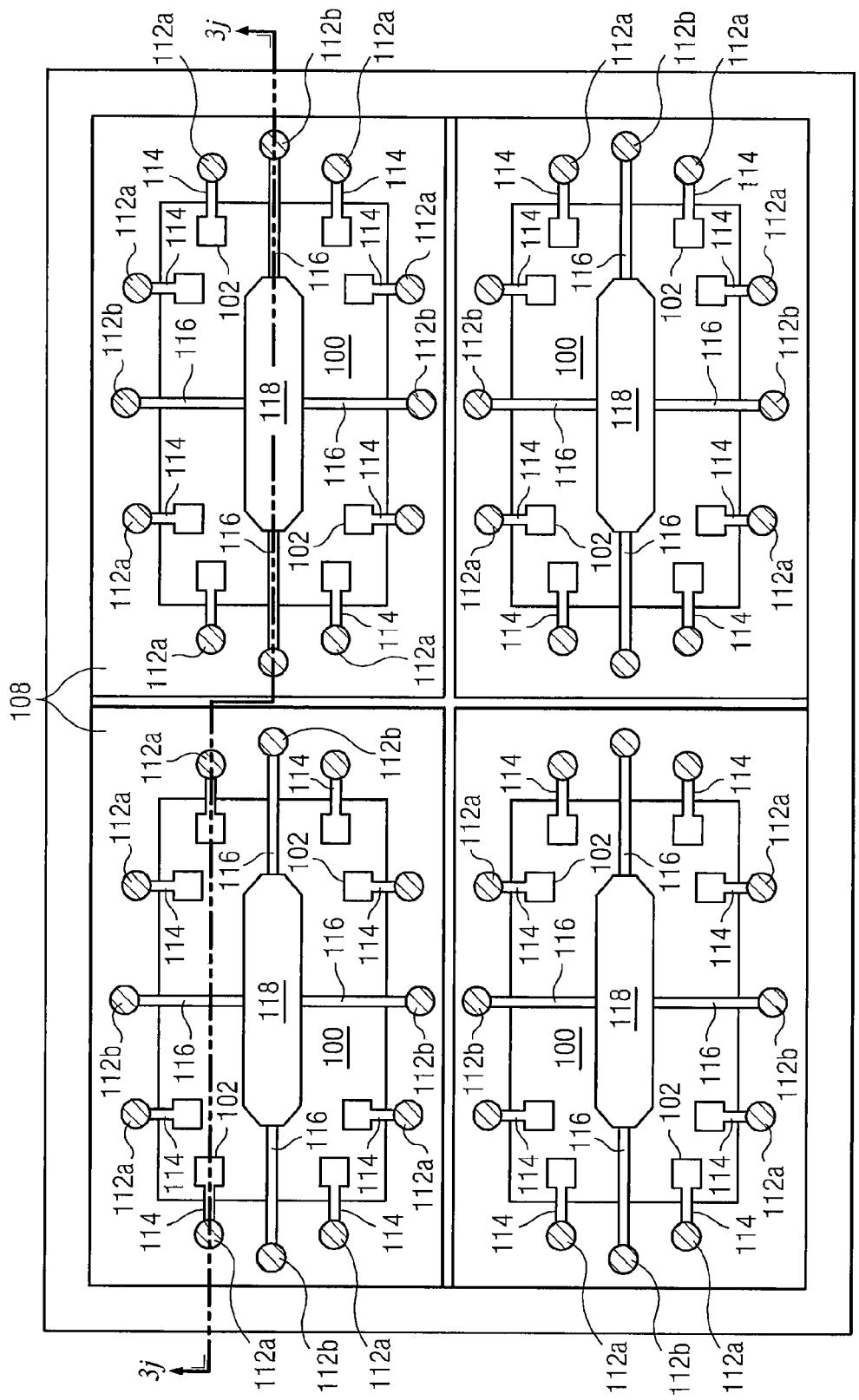

Turning to FIG. 3k, dicing equipment 122 (shown on FIG. 3l) is used to singulate dies 100 by cutting through encapsulant 108. Dies 100 may be singulated or diced using mechanical sawing or laser cutting to cut through encapsulant 108 to separate the dies. FIG. 3l shows a cross-sectional view of the manufacturing step taken along plane 3l of FIG. 3k. As shown in FIG. 3l, each of the dies 100 are physically separated by cutting through a portion of encapsulant 108.

Using the present methods, a semiconductor package can be fabricated that includes thermal vias formed within organic materials surrounding a semiconductor die. The vias are not connected to bond pads of the semiconductor die. Instead, the thermal vias are in thermal communication with hot spots usually found in a central region of the semiconductor die.

The semiconductor package includes a plurality of thermal vias. The thermal vias may be formed in various layouts or configurations such as in two or more staggered rows of vias including one row for signal vias and one row for thermal vias. In one embodiment, a single row of vias consists of both signal and thermal vias. In addition to the formation of thermal vias, thermal traces are formed over a surface of the semiconductor die and connected to the thermal vias. The thermal traces are generally formed over hot spot regions of the die and act as a medium of heat transfer to transfer heat energy from within the semiconductor die to the thermal vias. In stacked configurations, signal vias may be bonded to adjacent signal vias, with thermal vias being bonded to adjacent thermal vias.

In an alternative embodiment, thermal channels are formed around an encapsulated chip or semiconductor die. The channel may be formed simultaneously with other through vias, or formed independently. In one embodiment, the vias and the thermal channel are formed of similar materials such as electroplated Cu. After singulation, the thermal channel is formed around the singulated die. The thermal channel facilitates dissipation of heat energy from the lateral sides of the encapsulated chip or semiconductor die.

Figure 4:
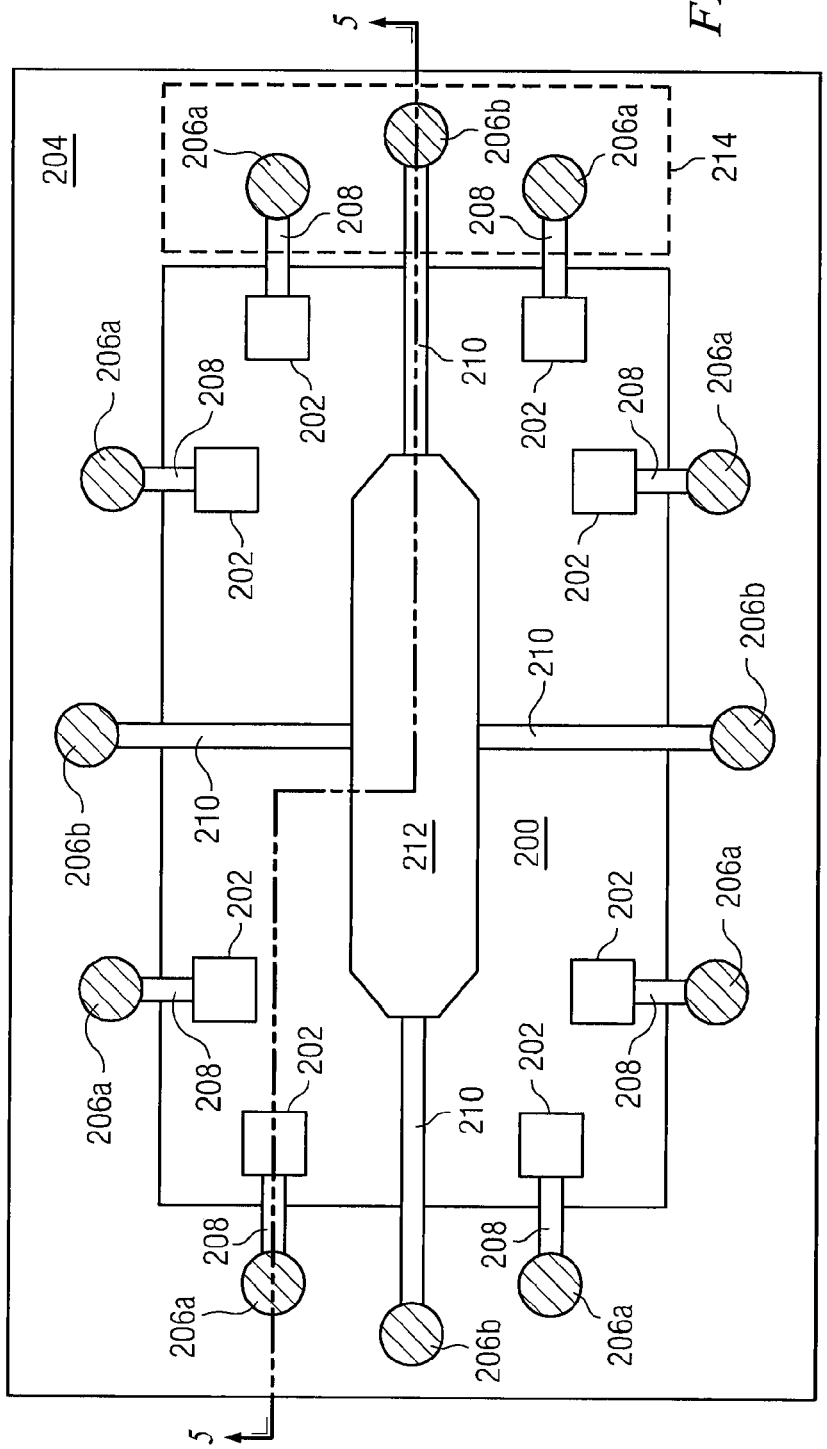
FIG. 4 illustrates a top view of an IC or semiconductor die package including peripheral organic materials having staggered rows of signal and thermal vias.

FIG. 4 illustrates a top view of an IC or semiconductor die package including peripheral organic materials having staggered rows of signal and thermal vias. The package includes semiconductor die or IC chip 200 having contact pads 202. Encapsulant 204 is deposited around die 200 to provide physical support and electrical insulation. Vias are formed in encapsulant 204 and a conductive material is deposited into the vias to form signal vias 206a and thermal vias 206b. The conductive material may include a metal such as Cu, Au, or Ag and is thermally conductive. Signal traces 208 are patterned and deposited to connect contact pads 202 of die 200 to signal vias 206a. Thermal traces 210 are patterned and deposited to connect thermal vias 206b and hot spots of the semiconductor die. Thermal traces 210 are connected to thermally conductive pad 212 formed over a central region of die 200. As indicated by 214, signal vias 206a and thermal vias 206b are formed in two staggered rows. The inner row is made up of signal vias 206a, while the outer row includes thermal vias 206b.

Figure 5:
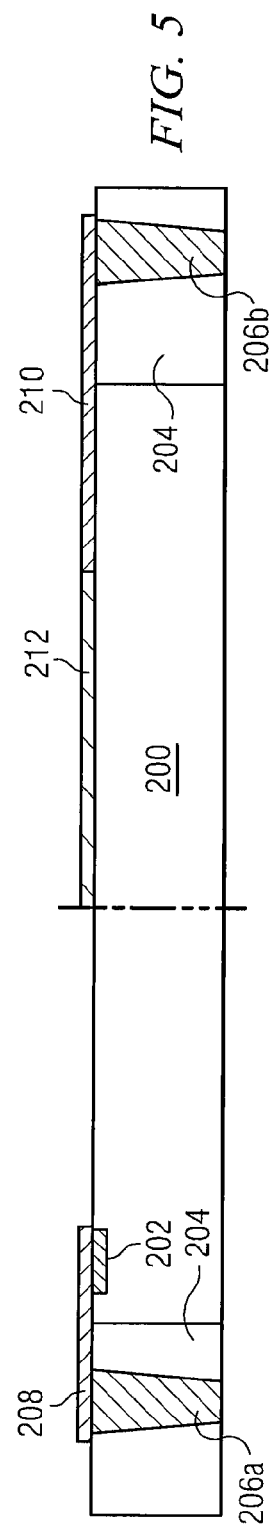
FIG. 5 illustrates a sectional view of the package of FIG. 4 taken along section plane 5 of FIG. 4.

FIG. 5 illustrates a sectional view of the package of FIG. 4 taken along section plane 5 of FIG. 4. Encapsulant 204 is deposited around semiconductor die or IC chip 200 having contact pads 202. Vias are formed in encapsulant 204 and a conductive material is deposited into the vias to form signal vias 206a and thermal vias 206b. Signal traces 208 are patterned and deposited to interconnect contact pads 202 of die 200 to signal vias 206a. Thermal traces 210 are patterned and deposited to interconnect thermal vias 206b and hot spots of the semiconductor die. Thermal traces 210 are connected to thermally conductive pad 212 formed over a central region of die 200.

Figure 6:
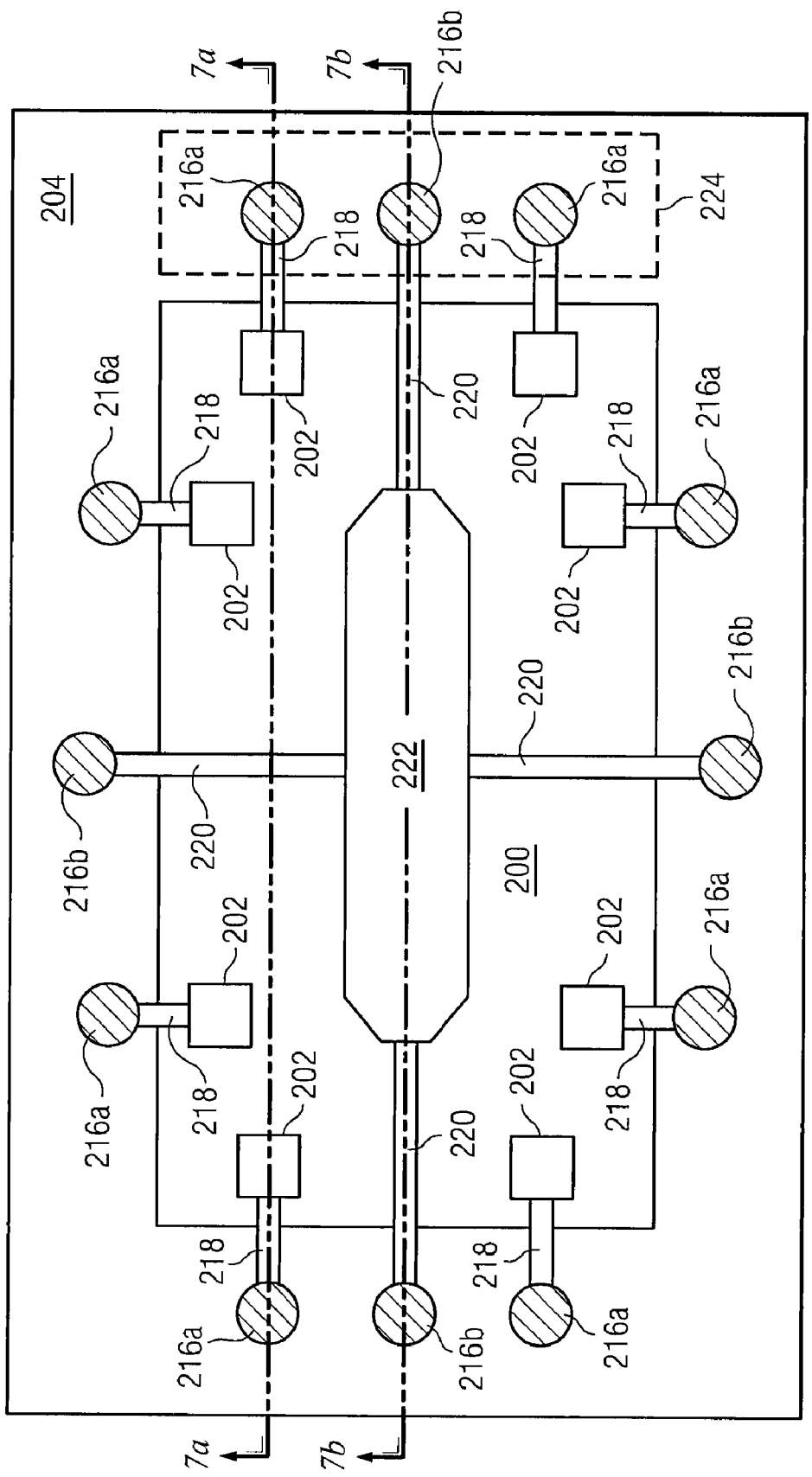
FIG. 6 illustrates a top view of a chip package including a single row of signal and thermal vias formed in the peripheral organic material.

FIG. 6 illustrates a top view of a chip package having a single row of signal and thermal vias. Encapsulant 204 is deposited around semiconductor die or IC chip 200 having contact pads 202. Vias are formed in encapsulant 204 and a conductive material is deposited into the vias to form signal vias 216a and thermal vias 216b. Signal traces 218 are patterned and deposited to interconnect contact pads 202 of die 200 to signal vias 216a. Thermal traces 220 are patterned and deposited to interconnect thermal vias 216b and hot spots of the semiconductor die. Thermal traces 220 are connected to thermally conductive pad 222 formed in a central region of die 200. As indicated by 224, signal vias 216a and thermal vias 216b are formed in single row of vias. The row includes a combination of alternating signal vias 216a and thermal vias 216b.

Figure 7A:
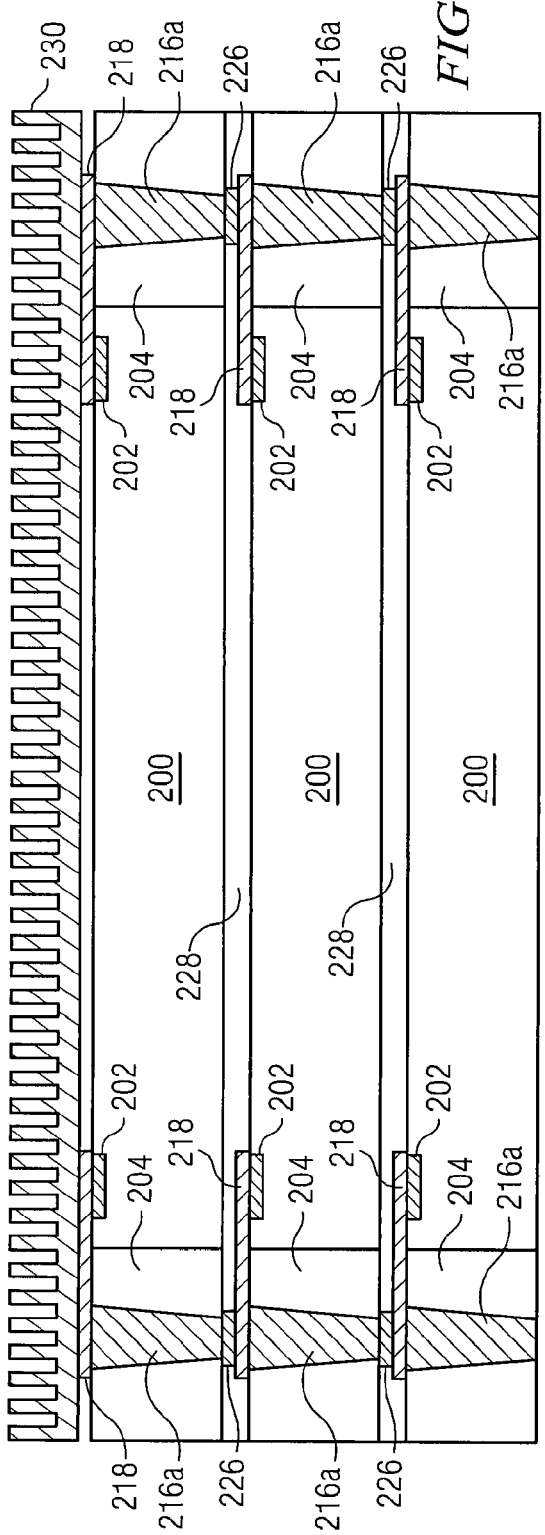
FIGS. 7*a* and 7*b* illustrate a semiconductor package including a plurality of stacked chip packages having signal and thermal vias and an attached heat sink.
Figure 7B:
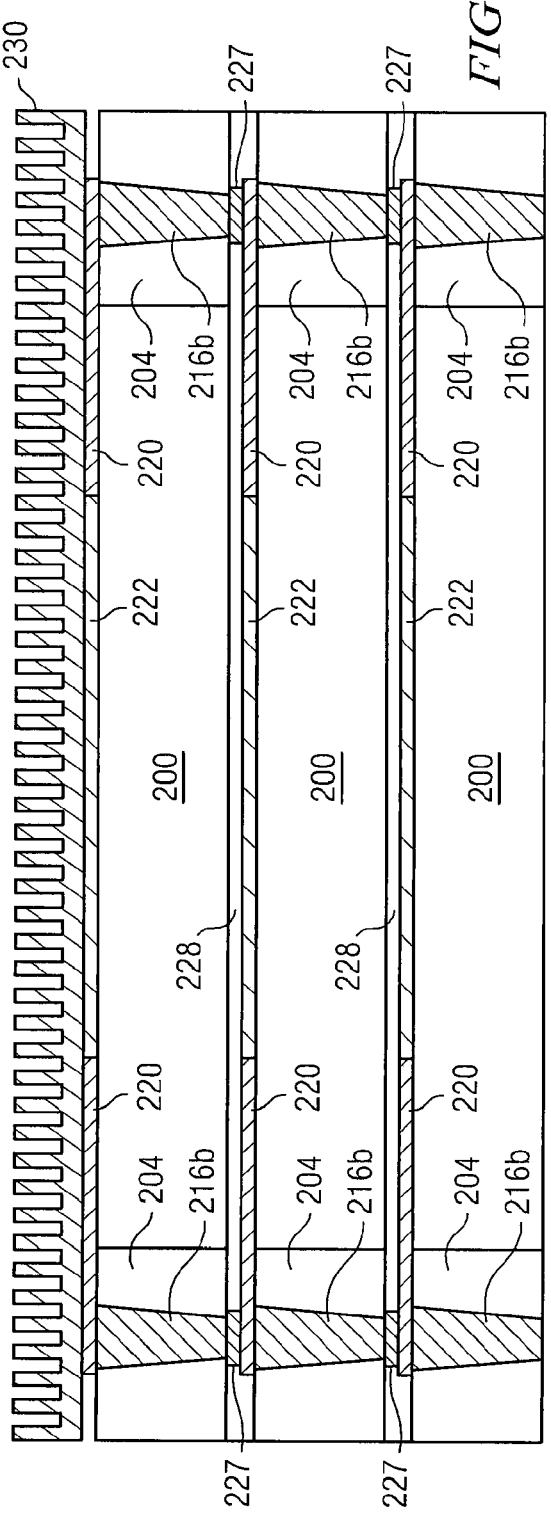

FIGS. 7a and 7b illustrate a semiconductor package including a plurality of stacked chip packages with an attached heat sink. In FIGS. 7a and 7b a plurality of the chip packages shown in FIG. 6 are stacked over each other. FIG. 7a illustrates a cross-sectional view of the chip packages taken along the section plane 7a of FIG. 6. Referring to FIG. 7a, in each of the stacked packages, encapsulant 204 is deposited around dies 200 with contact pads 202. Vias are formed in encapsulant 204 and a conductive material is deposited into the vias to form signal vias 216a. Signal traces 218 are patterned and deposited to interconnect contact pads 202 of dies 200 to signal vias 216a. In the vertically stacked configuration, signal vias 216a are disposed over one another. Bumps 226 are formed between signal vias 216a. Bumps 226 include an electrically and thermally conductive material such as a solder material or other electrically conductive material, e.g., Sn, Pb, Au, Ag, Cu, Zn, Bi, and alloys thereof, with an optional flux material. For example, the solder material can be eutectic Sn/Pb, high lead, or lead free. The solder material is deposited between signal vias 216a and is reflowed to form a mechanical and electrical connection between signal vias 216a. In alternative embodiments, other bonding agents such as stud bumping or a conductive adhesive may be used to connect signal vias 216a. Signal vias 216a may be connected with a material exhibiting good electrical conductivity, while the material used to connect thermal vias 216b (shown on FIG. 7b) exhibits good thermal conductivity. Underfill or thermal grease 228 is deposited between each of the packages to enhance the transfer of heat between each package. Heat sink 230 is mounted over the package using an adhesive or bonding material. In alternative embodiments, thermal sheets or heat spreaders may be deposited over the top-most die 200 in the package.

FIG. 7b illustrates a cross-sectional view of the package taken along the section plane 7b of FIG. 6. In each of the stacked packages, encapsulant 204 is deposited around dies 200. Vias are formed in encapsulant 204 and a thermally conductive material is deposited into the vias to form thermal vias 216b. Thermally conductive pad 222 is patterned and deposited over dies 200. Thermal traces 220 are patterned and deposited to interconnect conductive pad 222 and thermal vias 216b. In the vertically stacked configuration, thermal vias 216b are disposed over one another. Bumps 227 are formed between thermal vias 216b to connect thermal vias 216b. Underfill or thermal grease 228 is deposited between each of the packages to enhance the transfer of heat between each package. Heat sink 230 is mounted over the package using an adhesive or bonding material. In this configuration, the heat energy generated in each of dies 200 travels along thermal traces 220 from the hot spots of each die 200, and upwards through thermal vias 216b into heat sink 230 where it is then dissipated into the environment.

Figure 8:
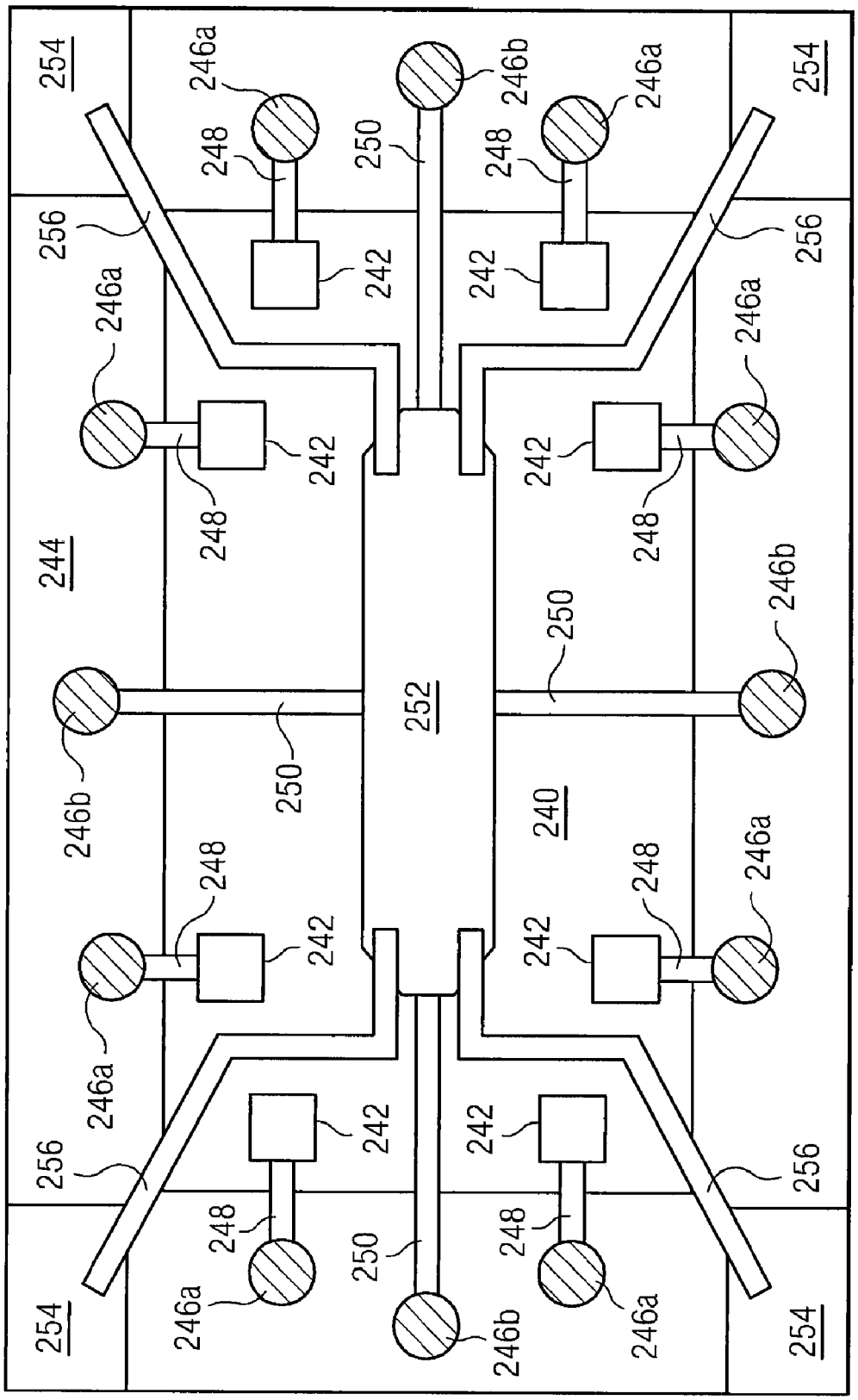
FIG. 8 illustrates a top view of a semiconductor package having broad thermal traces formed over vacant spaces of the organic or encapsulant materials.

FIG. 8 illustrates a top view of a semiconductor package including broad thermal traces formed over vacant spaces of organic or encapsulant materials. Organic material or encapsulant 244 is deposited around semiconductor die or IC chip 240 having contact pads 242. Vias are formed in encapsulant 244 and a conductive material is deposited into the vias to form signal vias 246a and thermal vias 246b. Signal traces 248 are patterned and deposited to interconnect contact pads 242 of die 240 to signal vias 246a. Thermal traces 250 are patterned and deposited to interconnect thermal vias 246b and hot spots of the semiconductor die. Thermal traces 250 are connected to thermally conductive pad 252 formed over a central region of die 240. A thermally conductive material is patterned and deposited over the package to form broad thermal traces 254 around a perimeter of the package. Traces 254 may be formed having any shape and over any region of the package—for example over the vacant spaces of encapsulant 244. Traces 256 are patterned and deposited over the package to form a thermal connection between die 240 or thermally conductive pad 252 and traces 254. In an alternative embodiment, encapsulant 244 under traces 254 is etched and one or more thermal vias are formed below traces 254. Traces 254 may be formed at any scale and have any appropriate dimensions.

FIG. 9a illustrates a plan view of an IC or semiconductor die package having a staggered dual row via configuration with exposed thermal vias. The package includes semiconductor die or IC chip 300 having contact pads 302. Encapsulant 304 is deposited around die 300 to provide physical support and electrical insulation. Vias are formed in encapsulant 304 and a conductive material is deposited into the vias to form signal vias 306a and thermal vias 306b. The conductive material includes a metal such as Cu, Au, or Ag and is thermally conductive. Signal traces 308 are patterned and deposited to interconnect contact pads 302 of die 300 to signal vias 306a. Thermal traces 310 are patterned and deposited to interconnect thermal vias 306b and hot spots of the semiconductor die. Thermal traces 310 are connected to thermally conductive pad 312 formed over a central region of die 300. During singulation, the dies are separated by cutting through encapsulant 304 and a portion of thermal vias 306b. Accordingly, with the dies singulated, thermal vias 306b are exposed around a perimeter of the package. Signal vias 306a are located inwardly from thermal vias 306b. In this configuration, heat is transferred from die 300 into thermally conductive pad 312 and traces 310 and into thermal vias 306b. From there, heat may be dissipated into the environment by thermal vias 306b from the sides of the chip package. Signal vias 306a and thermal vias 306b are formed in two staggered rows. The inner row is made up of signal vias 306a, while the outer row includes thermal vias 306b.

FIG. 9b illustrates a cross-sectional view of the package shown in FIG. 9a taken along section plane 9b. Encapsulant 304 is deposited around semiconductor die or IC chip 300 having contact pads 302. Vias are formed in encapsulant 304 and a conductive material is deposited into the vias to form signal vias 306a and thermal vias 306b. Signal traces 308 are patterned and deposited to interconnect contact pads 302 of die 300 to signal vias 306a. Thermal traces 310 are patterned and deposited to interconnect thermal vias 306b and thermally conductive pad 312 formed over a central region of die 300.

Figure 10A:
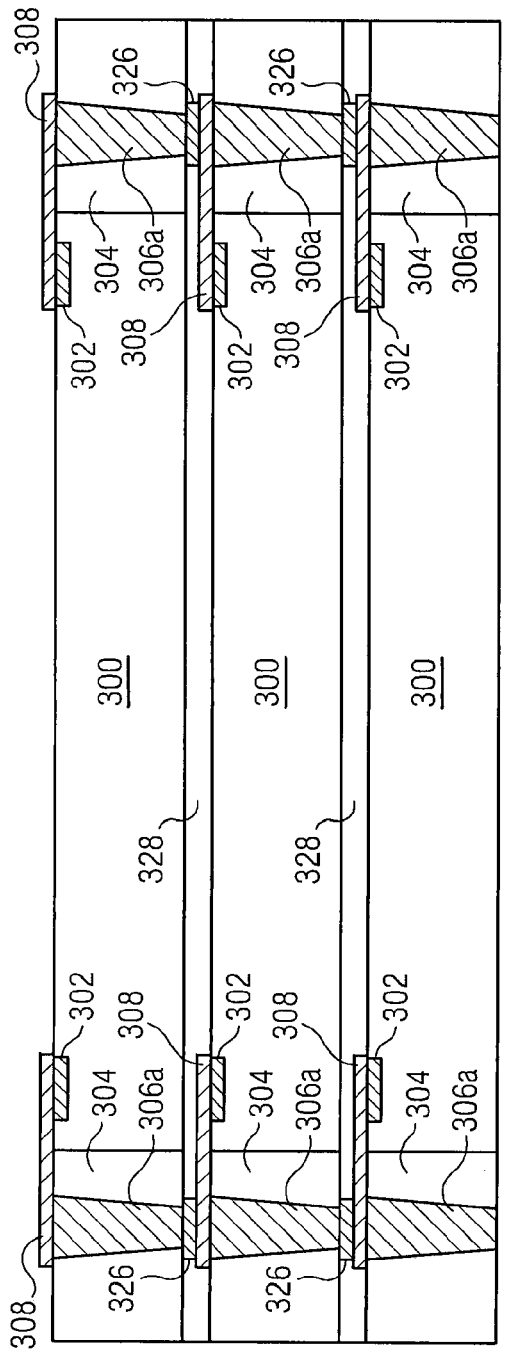
FIGS. 10*a* and 10*b* illustrate cross-sectional views of a plurality of stacked chip packages including two rows of signal and thermal vias.
Figure 10B:
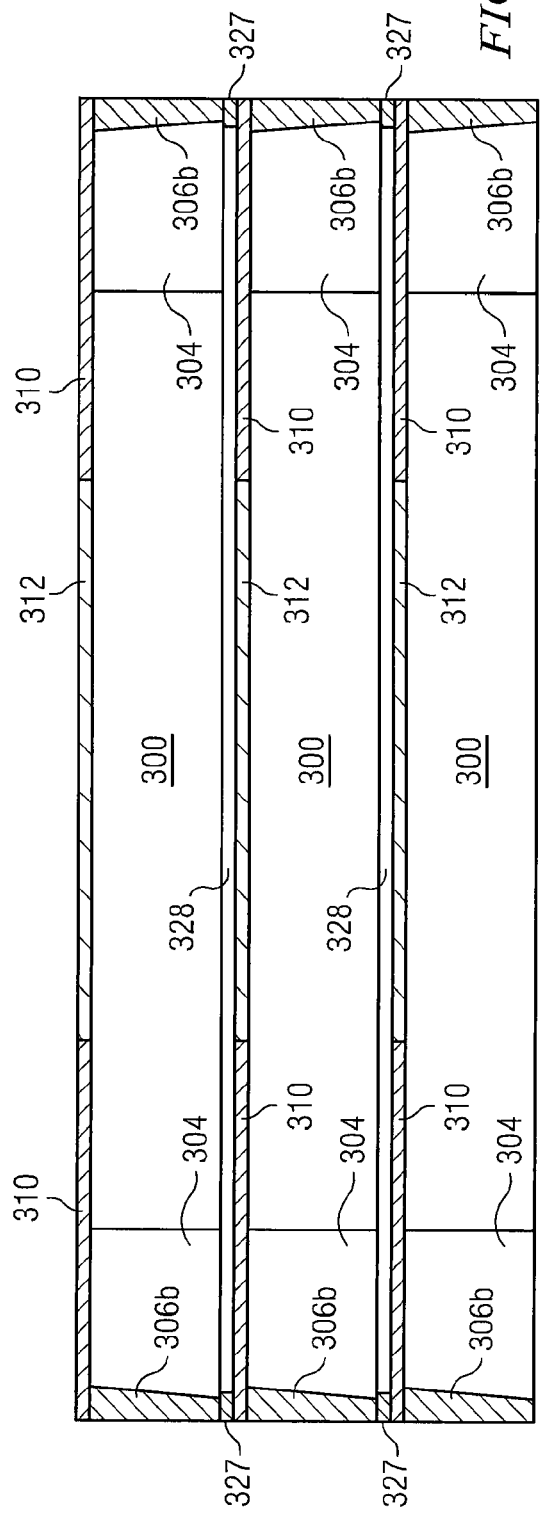

FIGS. 10a and 10b illustrate cross-sectional views of a plurality of stacked chip packages including two rows of signal and thermal vias. FIG. 10a illustrates a section of the chip packages including signal vias. In each chip package, encapsulant 304 is deposited around dies 300 with contact pads 302. Vias are formed in encapsulant 304 and a conductive material is deposited into the vias to form signal vias 306a. Signal traces 308 are patterned and deposited to interconnect contact pads 302 of dies 300 to signal vias 306a. In the vertically stacked configuration, signal vias 306a are disposed over one another. Bumps 326 are formed between signal vias 306a to connect signal vias 306a. Bumps 326 include an electrically and thermally conductive material such as a solder material or other electrically conductive material, e.g., Sn, Pb, Au, Ag, Cu, Zn, Bi, and alloys thereof, with an optional flux material. For example, the solder material can be eutectic Sn/Pb, high lead, or lead free. The solder material is deposited between signal vias 306a and is reflowed to form a mechanical and electrical connection between signal vias 306a. In alternative embodiments, other bonding agents such as stud bumping, or a conductive adhesive may be used to connect signal vias 306a and thermal vias 306b (shown on FIG. 10b). Signal vias 306a may be connected with a material exhibiting good electrical conductivity, while the material used to connect thermal vias 306b exhibits good thermal conductivity. Underfill or thermal grease 328 is deposited between each of the packages to enhance the transfer of heat between each package.

FIG. 10b illustrates a section of the package showing the thermal vias of each chip package configured to remove heat from die 300. In each chip package, encapsulant 304 is deposited around dies 300. Vias are formed in encapsulant 304 and a thermally conductive material is deposited into the vias to form thermal vias 306b. Thermal traces 310 are patterned and deposited to interconnect thermal vias 306b and thermally conductive pad 312. In the vertically stacked configuration, thermal vias 306b are disposed over one another. Bumps 327 are formed between thermal vias 306b to electrically and mechanically connect thermal vias 306b. In alternative embodiments, other bonding agents such as stud bumping, or a conductive adhesive may be used to connect thermal vias 306b. Underfill or thermal grease 328 is deposited between each of the packages to enhance the transfer of heat between each package. An optional heat sink, thermal sheet, or heat spreader may be mounted over the package using an adhesive or bonding material. In this configuration, because thermal vias 306b are formed around a perimeter of each package, thermal energy is also dissipated from each side of the package.

FIG. 11a illustrates a plan view of an IC or semiconductor die package having a single row of signal and thermal vias. The package includes semiconductor die or IC chip 400 having contact pads 402. Encapsulant 404 is deposited around die 400 to provide physical support and electrical insulation. Vias are formed in encapsulant 404 and a conductive material is deposited into the vias to form signal vias 406a and thermal vias 406b. The conductive material includes a metal such as Cu, Au, or Ag and is thermally conductive. Signal traces 408 are patterned and deposited to interconnect contact pads 402 of die 400 to signal vias 406a. Thermal traces 410 are patterned and deposited to interconnect thermal vias 406b and hot spots of the semiconductor die. Thermally conductive pad 412 is patterned and deposited over a central region of die 400. Thermal traces 410 are connected to thermally conductive pad 412. After singulation, thermal vias 406b are exposed around a perimeter of the package. Heat is transferred from die 400 into thermally conductive pad 412 and traces 410 and into thermal vias 406b. From there, heat is dissipated into the environment from thermal vias 406b.

FIG. 11b illustrates a cross-sectional view of the package shown in FIG. 11a taken along section plane 11b. Encapsulant 404 is deposited around semiconductor die or IC chip 400 having contact pads 402. Vias are formed in encapsulant 404 and a conductive material is deposited into the vias to form signal vias 406a and thermal vias 406b. Signal traces 408 are patterned and deposited to interconnect contact pads 402 of die 400 to signal vias 406a. Thermal traces 410 are patterned and deposited to interconnect thermal vias 406b and thermally conductive pad 412 formed over a central region of die 400. Signal vias 406a and thermal vias 406b are formed in single rows containing both signal vias 406a and thermal vias 406b. After singulation, thermal vias 406b are exposed around a perimeter of the package. Heat is transferred from die 400 into thermally conductive pad 412 and traces 410 and into thermal vias 406b. From there, heat is dissipated into the environment from the thermal vias.

FIGS. 12a and 12b illustrate cross-sectional views of a package including a plurality of stacked chip packages having single rows of alternating signal and thermal vias. FIG. 12a illustrates a cross-sectional view showing the signal vias of each chip package. In each chip package, encapsulant 404 is deposited around dies 400 with contact pads 402. Vias are formed in encapsulant 404 and a conductive material is deposited into the vias to form signal vias 406a. Signal traces 408 are patterned and deposited to interconnect contact pads 402 of dies 400 to signal vias 406a. In the vertically stacked configuration, signal vias 406a are disposed over one another. Bumps 426 are formed between signal vias 406a to interconnect the signal vias 406a. Bumps 426 include an electrically and thermally conductive material such as a solder material or other electrically conductive material, e.g., Sn, Pb, Au, Ag, Cu, Zn, Bi, and alloys thereof, with an optional flux material. The solder material is deposited between the vias and is reflowed to form a mechanical and electrical connection between signal vias 406a. Underfill or thermal grease 428 is deposited between each of the packages to enhance the transfer of heat between each package.

FIG. 12b illustrates a cross-sectional view showing the thermal vias of each chip package for removing heat from dies 400. In each chip package, encapsulant 404 is deposited around dies 400. Vias are formed in encapsulant 404 and a thermally conductive material is deposited into the vias to form thermal vias 406b. Thermal traces 410 are patterned and deposited to interconnect thermal vias 406b and hot spots of the semiconductor dies. In the vertically stacked configuration, thermal vias 406b are disposed over one another. Bumps 427 are formed between thermal vias 406b to interconnect the thermal vias 406b. Underfill or thermal grease 428 is deposited between each of the packages to enhance the transfer of heat between each package. An optional heat sink, thermal sheet, or heat spreader is mounted over the package using an adhesive or bonding material. In this configuration, because thermal vias 406b are formed around a perimeter of each package, thermal energy is dissipated from each side of the package.

Figure 13A:
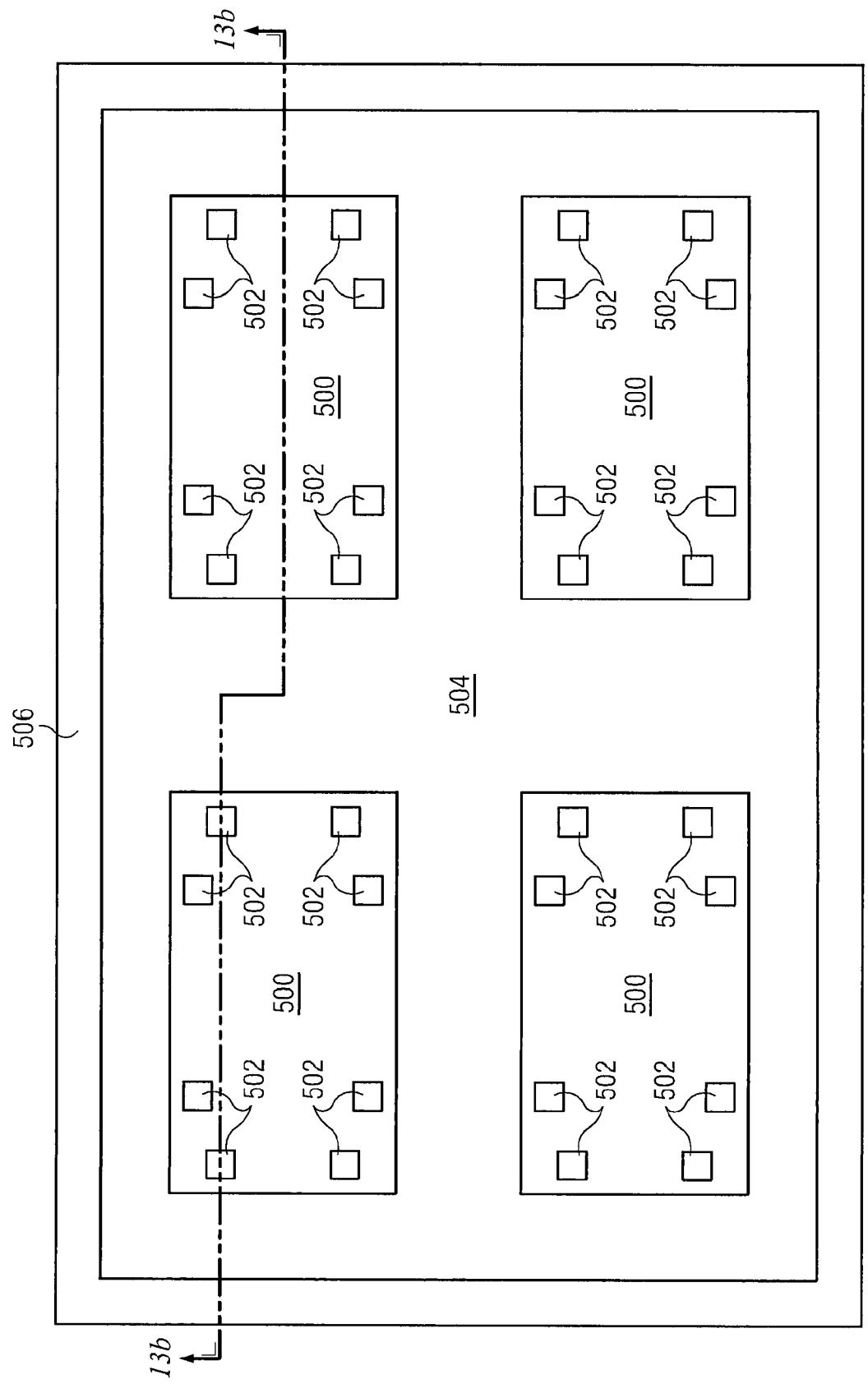

FIGS. 13a-13l illustrate a process of manufacturing an IC package having a peripheral thermal channel and conductive signal vias. Referring to FIG. 13a, semiconductor dies 500 are mounted to chip carrier 504. Contact pads 502 include a conductive material and are formed over a surface of dies 500 by a PVD, CVD, electrolytic plating, or electroless plating process. An optional adhesive (not shown) may be used to fix dies 500 to carrier 504. Carrier 504 includes any substrate, apparatus or other structure suitable for mounting a plurality of semiconductor die or other electronic components. Carrier 504 may be expandable for creating and/or expanding gaps between each of the semiconductor die or other electronic components. Carrier 504 includes carrier walls 506 which are formed around a perimeter of carrier 504. FIG. 13b shows a cross-sectional view of the fabrication process shown in FIG. 13a taken along section plane 13b. As shown in FIG. 13b, Dies 500 are mounted over carrier 504. An optional adhesive may be used to bond dies 500 to carrier 504.

Figure 13C:
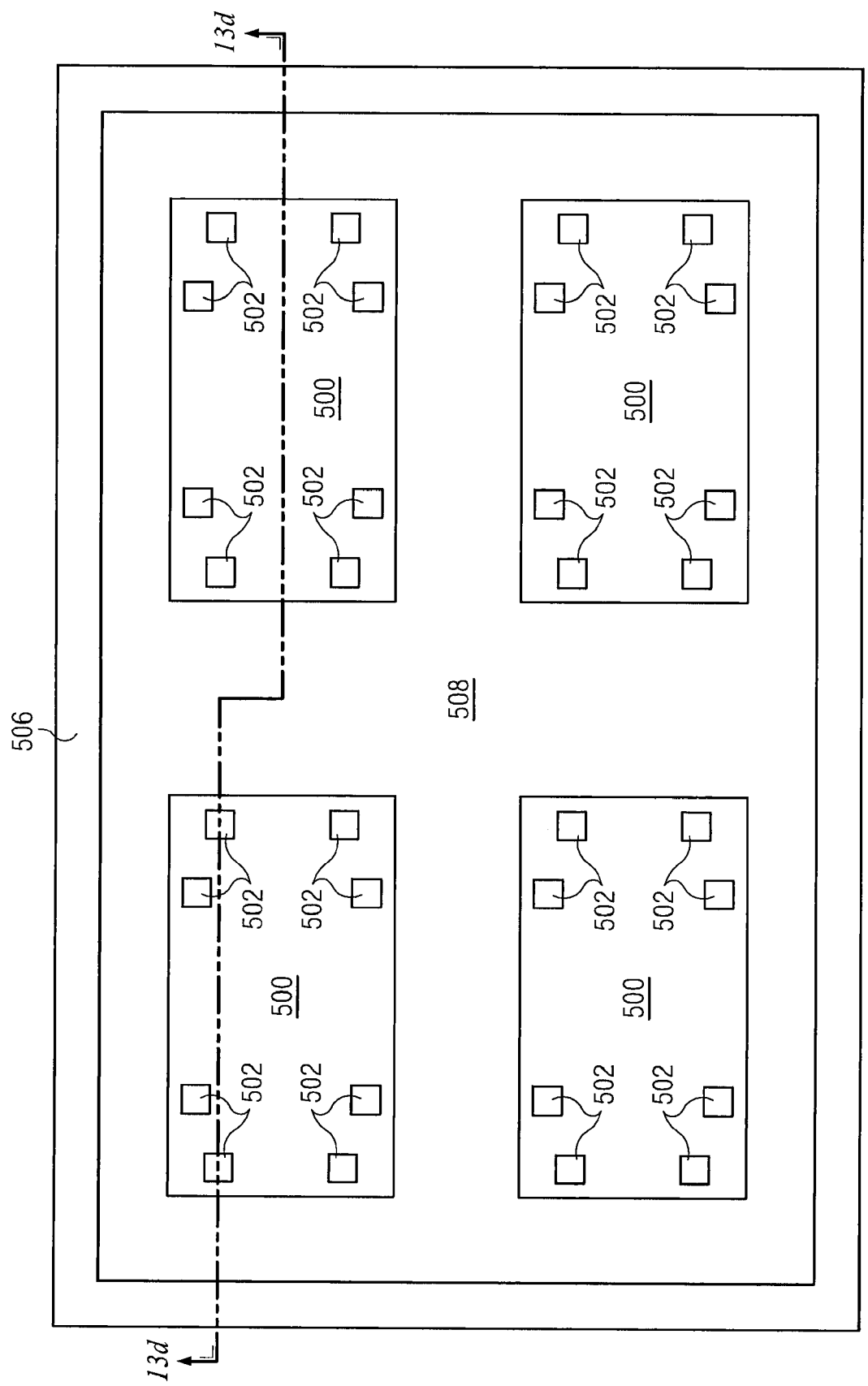

Turning to FIG. 13c, encapsulant 508 is deposited over carrier 504 around dies 500. Encapsulant 508 includes mold compound, or other organic insulating materials. Encapsulant 508 is deposited using spin coating, needle dispensing, or other suitable application processes. Encapsulant 508 may further include a filler material to assist in matching the CTE of the package to encapsulant 508. A top surface of encapsulant 508 is approximately coplanar with a top surface of dies 500. Carrier walls 506 control the flow of encapsulant 508. FIG. 13d illustrates a cross-sectional view of the fabrication process shown in FIG. 13c taken along section plane 13d. As shown in FIG. 13d, encapsulant 508 is deposited to surround each of dies 500 mounted over carrier 504. Capillary action may be relied upon to cause encapsulant 508 to flow around and fill any gaps formed between dies 500.

Figure 13E:
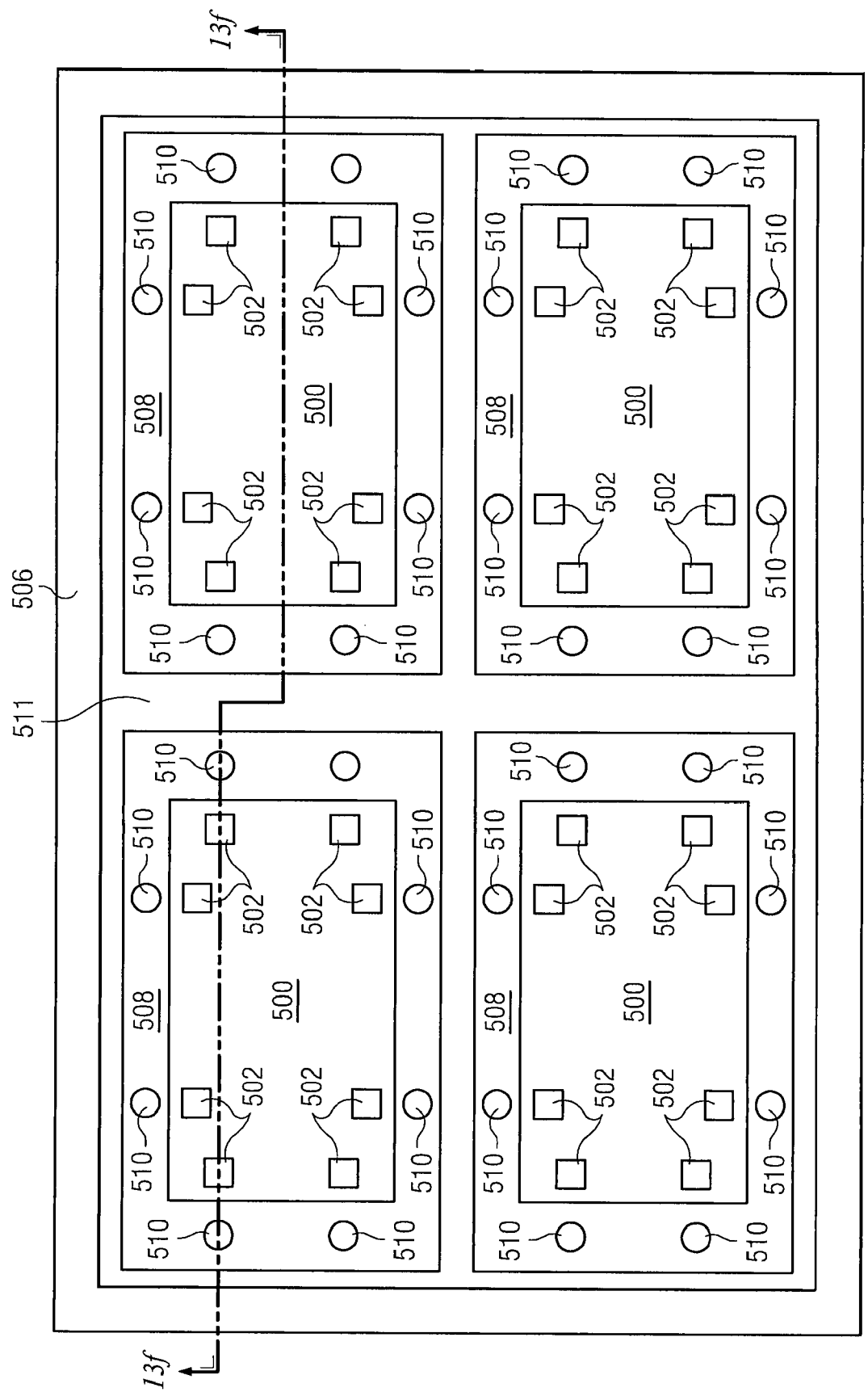
Figure 13F:
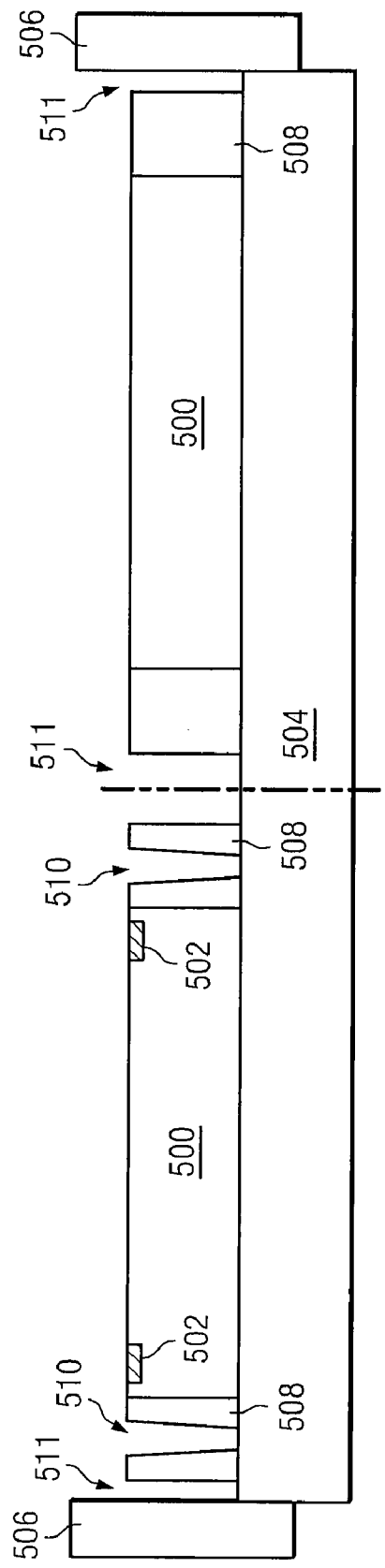

Turning to FIG. 13e, encapsulant 508 is etched. A laser drilling or other etching process is used to form vias 510 in encapsulant 508. Slots 511 are also formed in encapsulant 508 using an etching or laser drilling process. Slots 511 form a plurality of peripheral channels that run around each of dies 500. FIG. 13f illustrates a cross-sectional view of the manufacturing process shown in FIG. 13e taken along section plane 13f. Vias 510 and slots 511 are formed around dies 500 using an etching or laser drilling process. Vias 510 are generally shaped as conical frustums, however vias 510 may have any suitable shape.

Figure 13H:
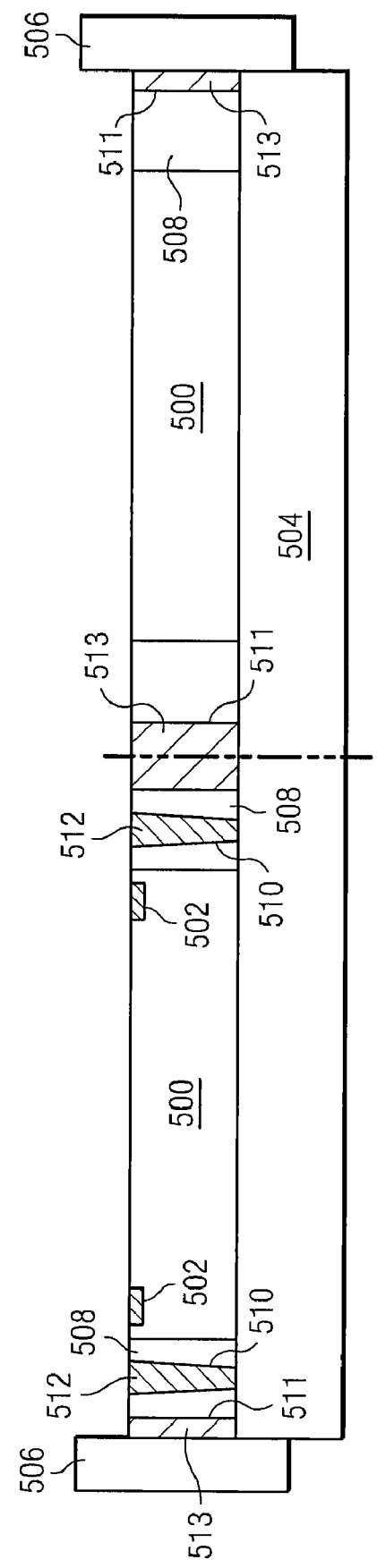
Figure 13G:
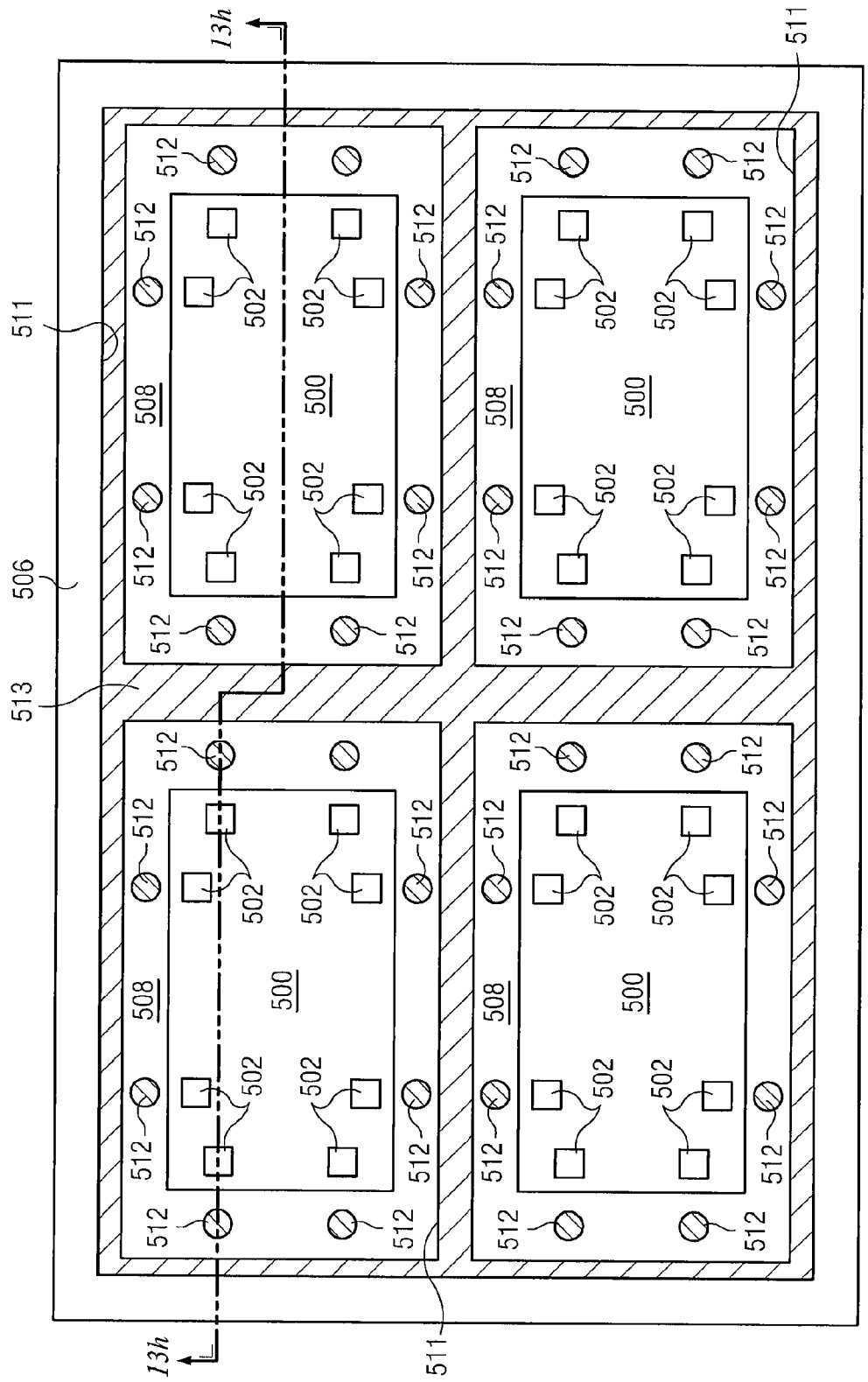

Turning to FIG. 13g, conductive material is deposited into vias 510 and slots 511 to form signal vias 512 and thermal channels 513. The conductive material includes metals such as Cu, Au, Ag, or other thermally and/or electrically conductive material. The conductive material may be deposited using needle dispensing, sputtering or electroplating processes. Before deposition or filling of vias 510 and slots 511, an optional seed layer may be pre-applied to enhance adhesion between the conductive material and encapsulant 508. Vias 510 and slots 511 may be filled simultaneously. However, alternative embodiments include filling vias 510 before or after the filling of slots 511. FIG. 13h illustrates a cross-sectional view of the fabrication process shown in FIG. 13g taken along section plane 13h showing signal vias 512 and thermal channels 513.

Figure 13I:
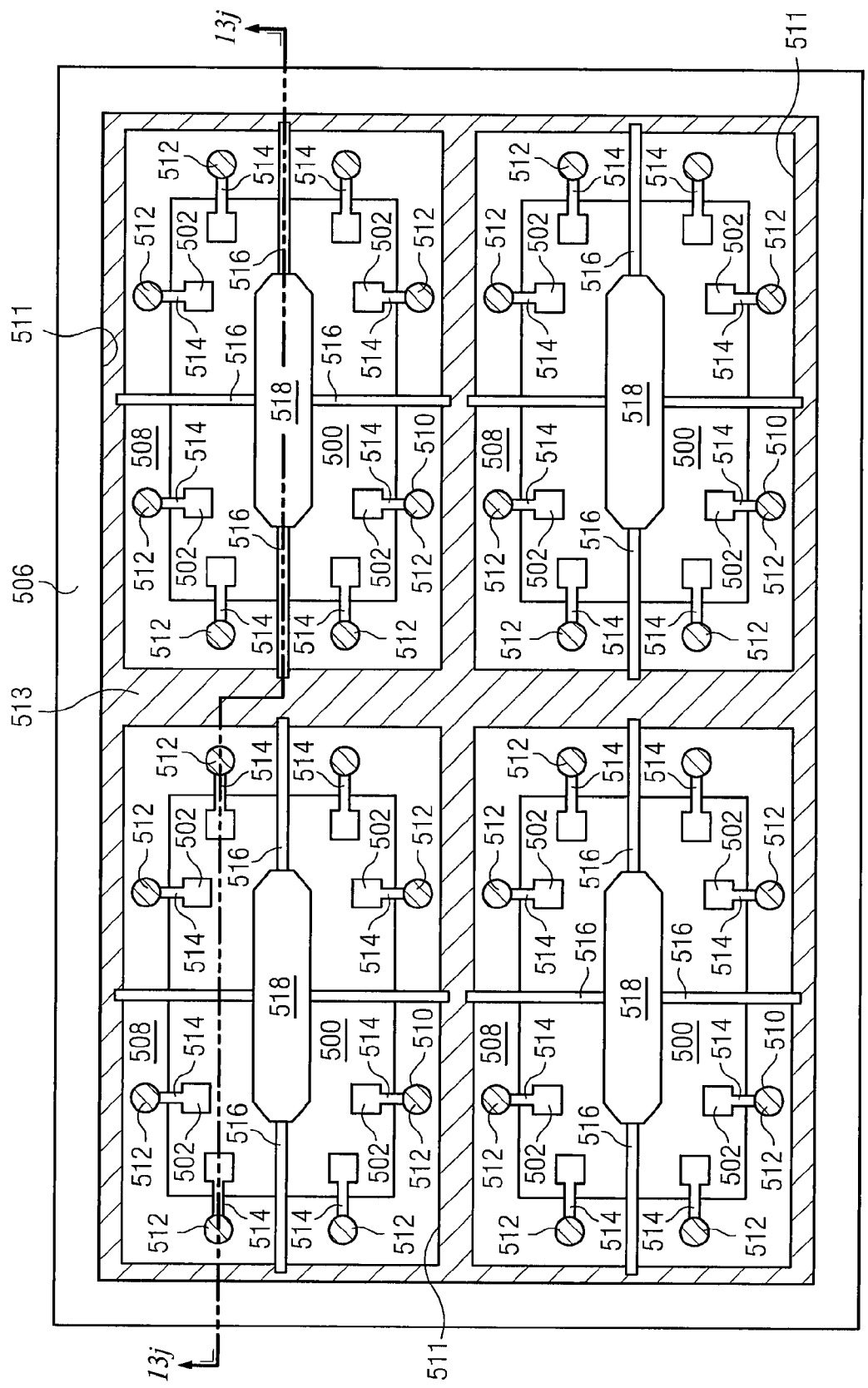

Turning to FIGS. 13i and 13j, a plurality of traces is formed over dies 500. FIG. 13j illustrates a cross-sectional view of the fabrication step shown in FIG. 13i taken along section plane 13j. Signal traces 514 are patterned and deposited to form electrical interconnections between contact pads 502 of dies 500 and signal vias 512. Thermal traces 516 are patterned and deposited between thermal channels 513 and conductive pad 518. Conductive pad 518 includes a thermally conductive material and is deposited over the hot spot areas of dies 500 where a majority of the heat energy generated by dies 500 is formed. In one embodiment, conductive pad 518 and thermal traces 516 include the same material and are formed during the same patterning and deposition process. Signal traces 514 include an electrically conductive material and carry electronic signals between the semiconductor die 500 and signal vias 512. Thermal traces 516 include a thermally conductive material such as metals and provide a pathway for heat to travel from hot spots of dies 500 through thermal traces 516 and into thermal channels 513. After being transferred into thermal channels 513, the heat energy can be removed from the package. Thermal channels 513 do not connect to bond pads 502 of dies 500 and do not carry electrical signals.

Figure 13K:
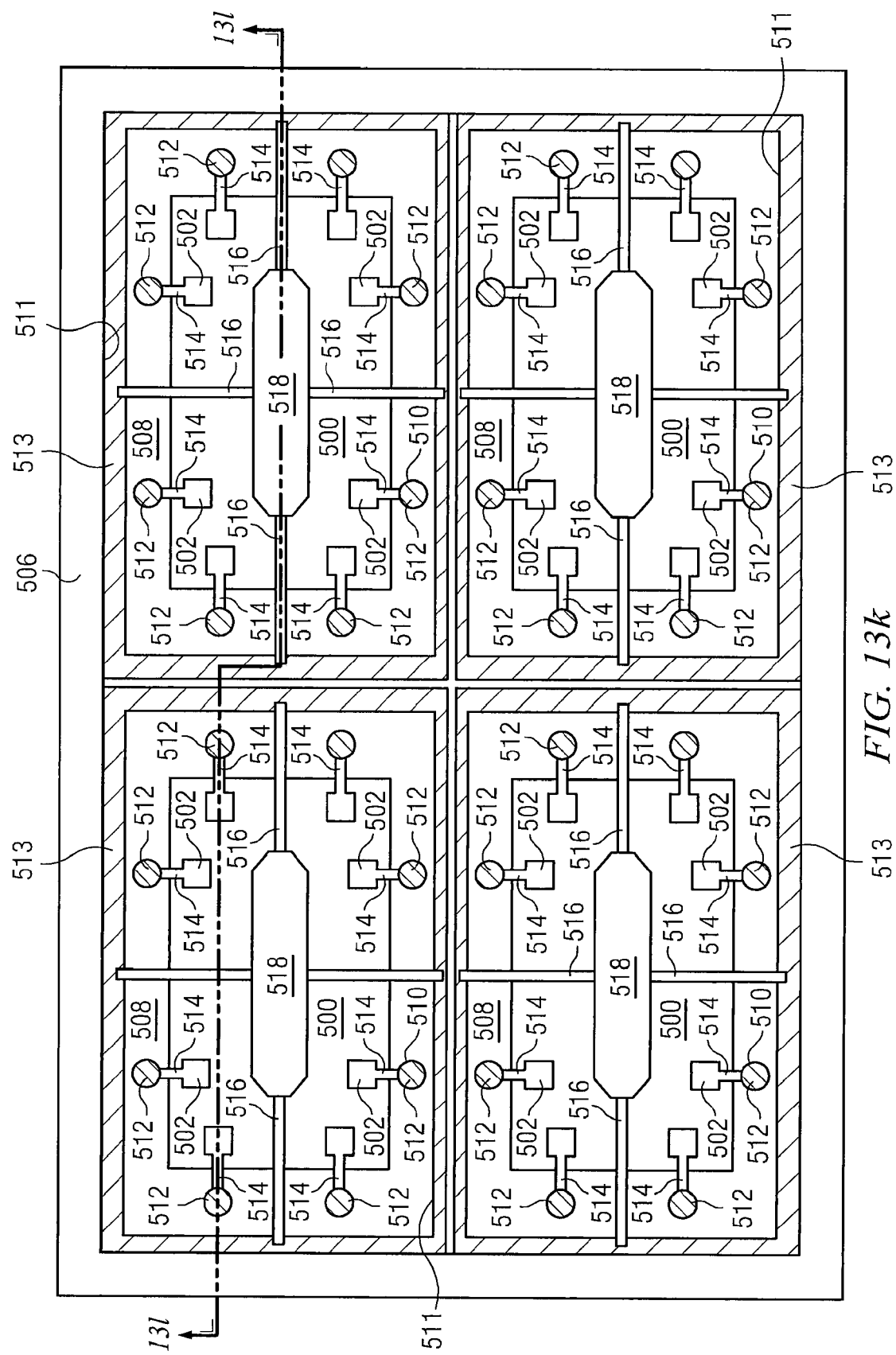

Turning to FIG. 13k, dicing equipment 522 (shown in FIG. 13l) is used to singulate dies 500 by cutting through thermal channels 513. Dies 500 may be singulated or diced using mechanical sawing or laser cutting to cut through thermal channels 513 to separate the dies. FIG. 13l shows a cross-sectional view of the manufacturing step illustrated in FIG. 13k taken along section plane 13l. As shown in FIG. 13l, each of the dies 500 are physically separated by cutting through a portion of thermal channels 513. After singulation, thermal channels 513 are disposed around a perimeter of the packages and facilitate removal of heat from each of dies 500.

Figure 14A:
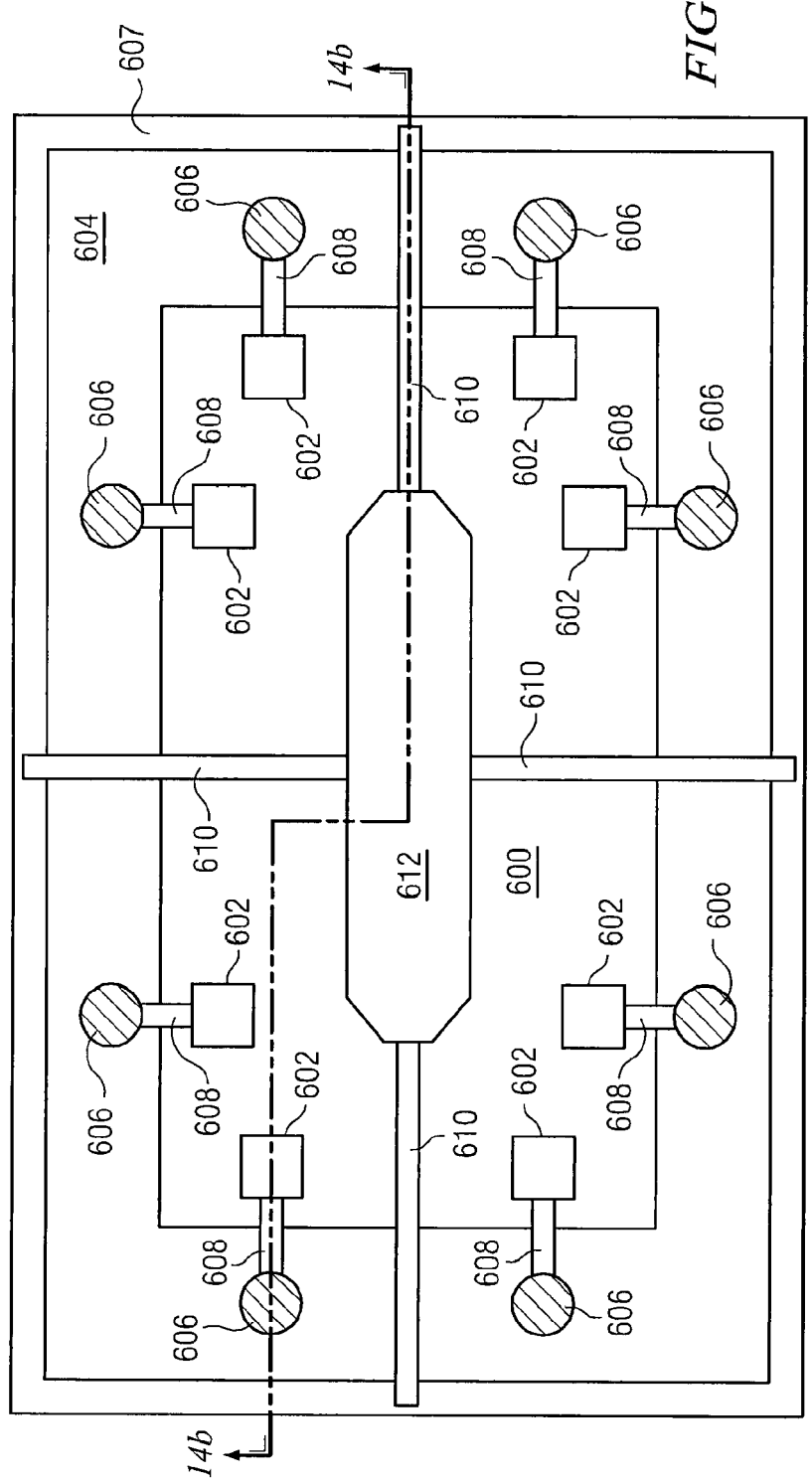
FIGS. 14*a* and 14*b* illustrate an IC or semiconductor die package having a row of signal vias and a peripheral thermal channel.

FIG. 14a illustrates a plan view of an IC or semiconductor die package having a row of signal vias and peripheral thermal channels. The package includes semiconductor die or IC chip 600 having contact pads 602. Encapsulant 604 is deposited around die 600 to provide physical support and electrical insulation. Vias are formed in encapsulant 604 and a conductive material is deposited into the vias to form signal vias 606. The conductive material includes a metal such as Cu, Au, or Ag and is thermally conductive. Slots are formed around die 600 using an etching or laser drilling process. A conductive material is deposited into the slots to form thermal channels 607. Signal traces 608 are patterned and deposited to interconnect contact pads 602 of die 600 to signal vias 606. Thermal traces 610 are patterned and deposited to interconnect thermal channels 607 and hot spots of the semiconductor die. Thermal traces 610 are connected to thermally conductive pad 612 formed over a central region of die 600. After singulation, thermal channels 607 are exposed around a perimeter of the package. Signal vias 606 are located inwardly from thermal channels 607. In this configuration, heat is transferred from die 600 into thermal traces 610 and into thermal channels 607. From there, heat is dissipated into the environment from thermal channels 607.

Figure 14B:
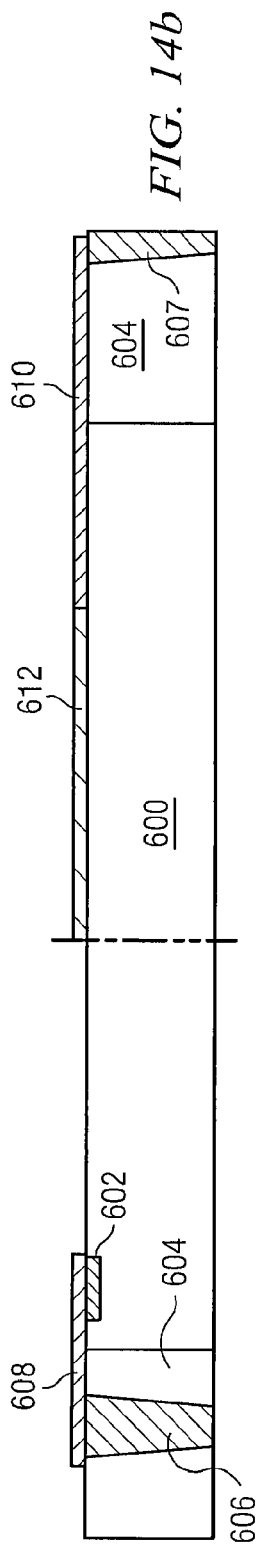

FIG. 14b illustrates a cross-sectional view of the package shown in FIG. 14a taken along section plane 14b. Encapsulant 604 is deposited around semiconductor die or IC chip 600 having contact pads 602. Vias are formed in encapsulant 604 and a conductive material is deposited into the vias to form signal vias 606. Conductive material is deposited into slots formed in encapsulant 604 to form thermal channel 607. Signal traces 608 are patterned and deposited to interconnect contact pads 602 of die 600 to signal vias 606. Thermal traces 610 are patterned and deposited to interconnect thermal channel 607 and thermally conductive pad 612 formed over a central region of die 600. Thermal channel 607 is formed around a perimeter of die 600.

Figure 15A:
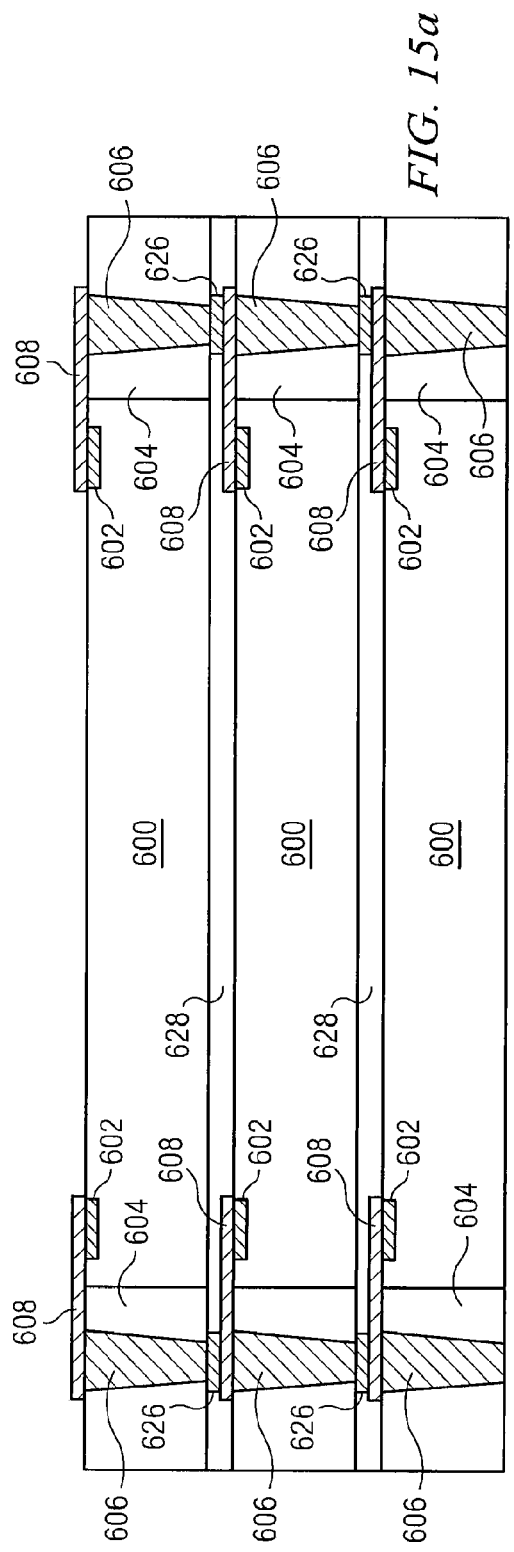
FIGS. 15*a* and 15*b* illustrate cross-sectional views of a semiconductor package including a plurality of stacked chip packages having rows of signal vias and thermal channels.
Figure 15B:
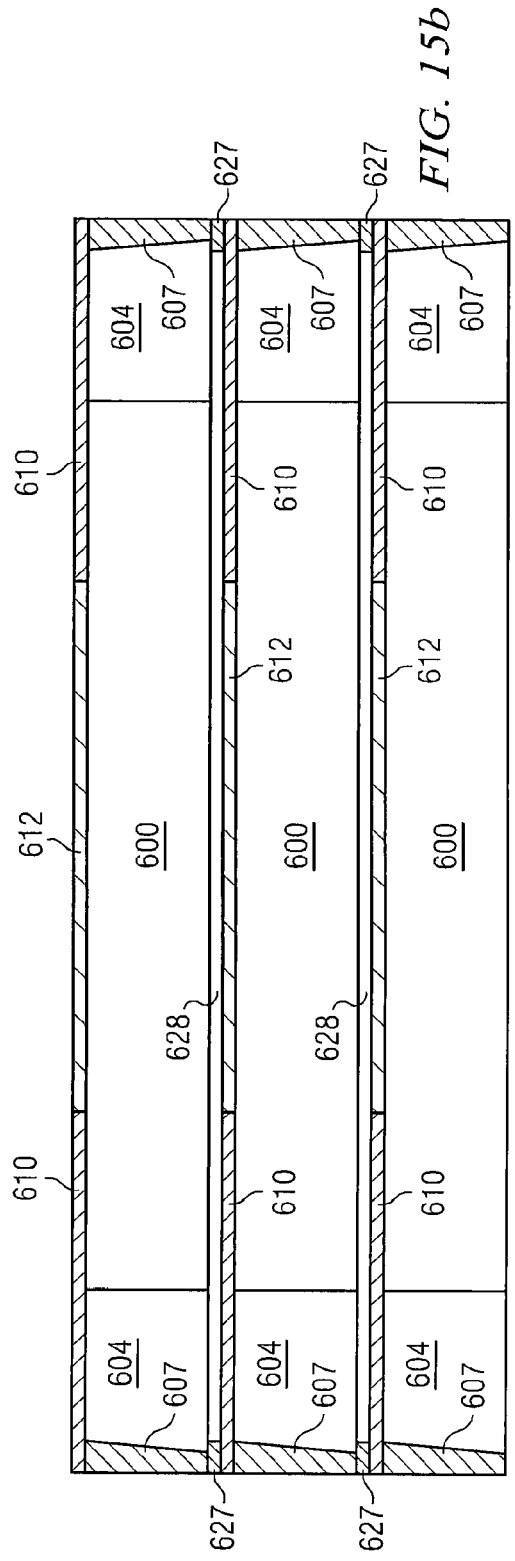

FIGS. 15a and 15b illustrate cross-sectional views of a plurality of stacked chip packages including a row of signal vias and thermal channels formed around each of the chip packages. FIG. 15a illustrates the signal vias of each chip package. In each chip package, encapsulant 604 is deposited around dies 600 with contact pads 602. Vias are formed in encapsulant 604 and a conductive material is deposited into the vias and slots to form signal vias 606. Signal traces 608 are patterned and deposited to interconnect contact pads 602 of dies 600 to signal vias 606. In the vertically stacked configuration, signal vias 606 are disposed over one another. Bumps 626 are formed between signal vias 606. Bumps 626 include an electrically and thermally conductive material such as a solder material or other electrically conductive material. Underfill or thermal grease 628 is deposited between each of the packages to enhance the transfer of heat between each package.

FIG. 15b illustrates the thermal channels of each chip package. In each chip package, encapsulant 604 is deposited around dies 600 with contact pads 602. Slots are formed in encapsulant 604 and a conductive material is deposited into the slots to form thermal channels 607. Thermal traces 610 are patterned and deposited to interconnect thermal channels 607 and thermally conductive pad 612 formed over die 600. In the vertically stacked configuration, thermal channels 607 are disposed over one another. Bumps 627 are formed between thermal channels 607 using a solder reflow process. Bumps 607 or another connection structure form a thermal interconnection between thermal channels 607. Underfill or thermal grease 628 is deposited between each of the packages to enhance the transfer of heat between each package. An optional heat sink, thermal sheet, or heat spreader may be mounted over the package using an adhesive or bonding material. In this configuration, because thermal channels 607 are formed around a perimeter of each package, thermal energy is dissipated from each side of the package.

Figure 16:
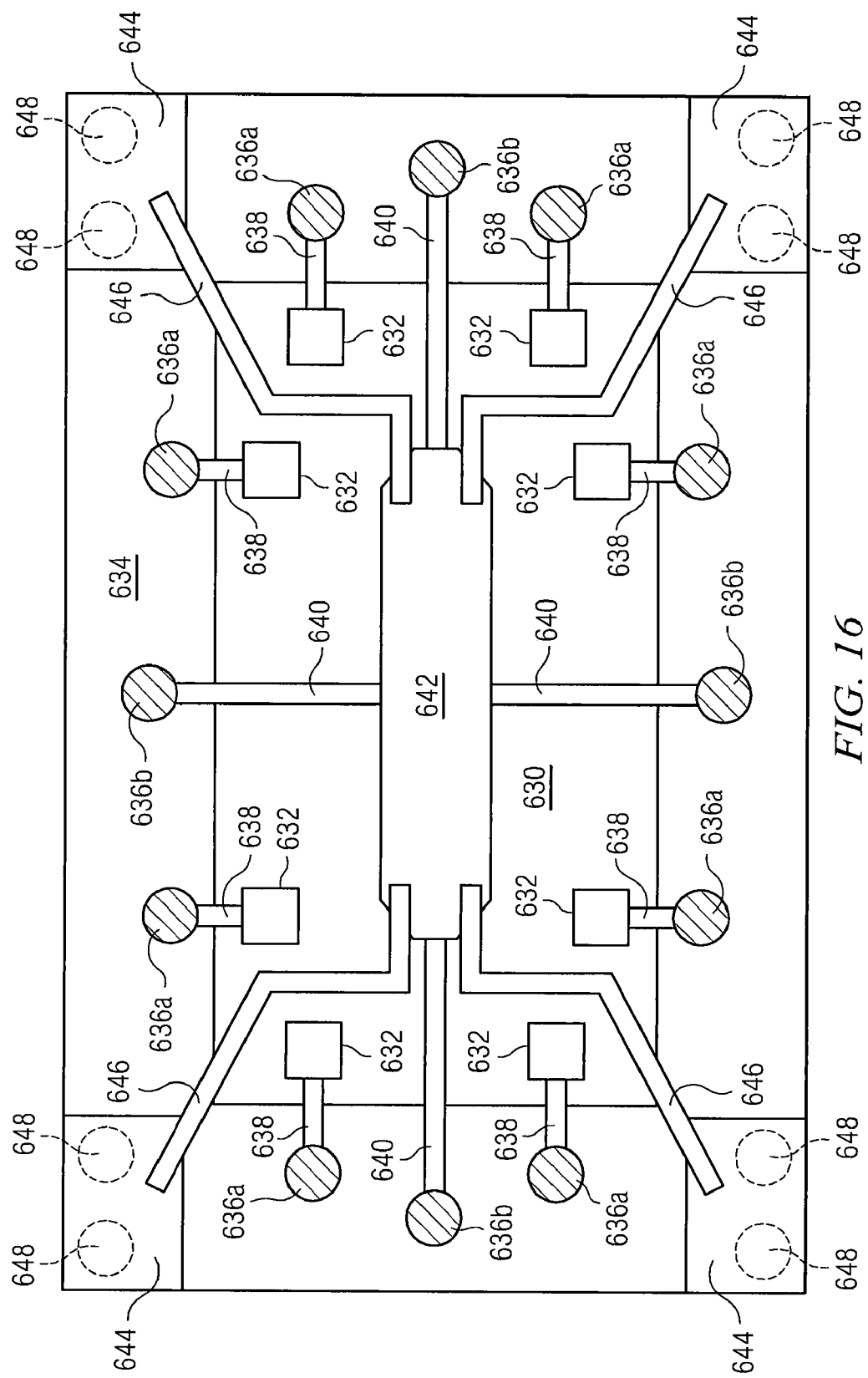
FIG. 16 illustrates a top view of a semiconductor package including broad thermal traces formed over vacant spaces of organic or encapsulant materials, each broad thermal trace is connected to a thermal via.

FIG. 16 illustrates a top view of a semiconductor package including broad thermal traces formed over vacant spaces of organic or encapsulant materials, each broad thermal trace includes thermal vias disposed underneath the broad thermal trace. Organic material or encapsulant 634 is deposited around semiconductor die or IC chip 630 having contact pads 632. Vias are formed in encapsulant 634 and a conductive material is deposited into the vias to form signal vias 636a and thermal vias 636b. Signal traces 638 are patterned and deposited to interconnect contact pads 632 of die 630 to signal vias 636a. Thermal traces 640 are patterned and deposited to interconnect thermal vias 636b and hot spots of the semiconductor die. Thermal traces 640 are connected to thermally conductive pad 642 formed over a central region of die 630. A thermally conductive material is patterned and deposited over the package to form broad thermal traces 644 around a perimeter of the package. Traces 644 may have any shape and be formed over any region of the package—for example over the vacant spaces of encapsulant 634. Traces 646 are patterned and deposited over the package to form a thermal connection between die 630 (and specifically thermally conductive pad 642) and traces 644. Encapsulant 634 under traces 644 is etched and one or more thermal vias 648 are formed below and in contact with traces 644. As heat enters traces 644 it is conducted into thermal vias 648. Traces 644 may be formed at any scale and have any appropriate dimensions.

FIGS. 17a and 17b illustrate cross-sectional views of a package including a plurality of stacked chip packages having thermal interconnections formed on alternating sides of the package. FIG. 17a illustrates the signal vias of each chip package. In each chip package, encapsulant 704 is deposited around dies 700 with contact pads 702. Vias are formed in encapsulant 704 and a conductive material is deposited into the vias to form signal vias 706a. Signal traces 708 are patterned and deposited to interconnect contact pads 702 of dies 700 to signal vias 706a. In the vertically stacked configuration, signal vias 706a are disposed over one another. Bumps 726 are formed between signal vias 706a. Underfill or thermal grease 728 is deposited between each of the packages to enhance the transfer of heat between each package.

FIG. 17b illustrates the thermal vias of each chip package. In each chip package, encapsulant 704 is deposited around dies 700. Vias are formed in encapsulant 704 and a thermally conductive material is deposited into the vias to form thermal vias 706b. Broad thermal traces 707 are formed over thermal vias 706b of each package. Thermally conductive pad 712 is deposited over dies 700. Thermal traces 710 are patterned and deposited to interconnect thermal vias 706b and broad thermal traces 707 to thermally conductive pad 712. In the vertically stacked configuration, thermal vias 706b are disposed over one another. Bumps 727 are formed to thermally interconnect some thermal vias 706b and broad thermal traces 707. With reference to FIG. 17, the chip packages are only thermally interconnected on alternating sides of each chip package via the alternating placement of thermally conductive bumps 727. Underfill or thermal grease 728 is deposited between each of the packages to enhance the transfer of heat between each package. An optional heat sink, thermal sheet, or heat spreader may be mounted over the package using an adhesive or bonding material. Heat energy from each chip package flows from dies 700, through thermal traces 710 and into thermal vias 706b. Some of the heat then flows upwards through the thermal vias 706b and broad thermal traces 707. In this configuration, heat energy from the lowest chip package flows upwards through broad thermal trace 707 and bump 727 located on the right side of the lowest package. In the next chip package, the heat flows across the package and up through broad thermal trace 707 and bump 727 located of the left side of the chip package. Accordingly, as each of semiconductor dies 700 generates heat, the heat energy flows upwards through alternating sides of each chip package. This configuration minimizes the heat flux congestion and prevents the build-up of heat energy in each of the chip packages.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor package, comprising:
   a semiconductor die having contact pads electrically connected to circuits within the semiconductor die;
   an encapsulant disposed around the semiconductor die;
   a plurality of conductive vias disposed in the encapsulant;
   a plurality of electrically conductive traces disposed between the contact pads and conductive vias;
   a thermally conductive channel disposed in the encapsulant separate from the conductive vias;
   a thermally conductive layer disposed over an area of heat generation of the semiconductor die; and
   a thermally conductive trace disposed between the thermally conductive layer and thermally conductive channel, wherein the thermally conductive layer, thermally conductive trace, and thermally conductive channel are electrically isolated from the contact pads of the semiconductor die and the electrically conductive traces.

2. The semiconductor package of claim 1, further comprising a plurality of broad thermal traces disposed over the encapsulant.

3. The semiconductor package of claim 2, further comprising a thermally conductive material interconnecting the broad thermal traces and the thermally conductive layer.

4. The semiconductor package of claim 1, further comprising a heat sink disposed over the semiconductor package.

5. The semiconductor package of claim 1, wherein the thermally conductive channel comprises a conductive through hole via (THV).

6. The semiconductor package of claim 1, wherein the thermally conductive channel is disposed around a portion of the semiconductor die.

7. A semiconductor package, comprising:
   a semiconductor die having a contact pad electrically connected to a circuit within the semiconductor die;
   an encapsulant disposed around the semiconductor die;
   first and second conductive vias disposed in the encapsulant;
   an electrically conductive trace disposed between the contact pad and first conductive via;
   a thermally conductive layer disposed over an area of heat generation of the semiconductor die; and
   a first thermally conductive trace disposed over the semiconductor die between the thermally conductive layer and second conductive via, wherein the thermally conductive layer, first thermally conductive trace, and second conductive via are electrically isolated from the contact pad of the semiconductor die and the electrically conductive trace.

8. The semiconductor package of claim 7, further comprising a broad thermal trace disposed over the encapsulant.

9. The semiconductor package of claim 8, further comprising a second thermally conductive trace disposed over the semiconductor die, the second thermally conductive trace connected to the broad thermal trace.

10. The semiconductor package of claim 7, further comprising a heat sink deposited over the semiconductor package.

11. The semiconductor package of claim 7, further comprising a thermal channel disposed around a periphery of the semiconductor die.

12. The semiconductor package of claim 11, wherein the thermal channel is disposed around a periphery of the encapsulant.

13. A semiconductor package, comprising:
    a semiconductor die having a contact pad electrically connected to a circuit within the semiconductor die;
    an encapsulant disposed around a portion of the semiconductor die;
    a conductive via disposed in the encapsulant;
    an electrically conductive trace disposed between the contact pad and the conductive via;
    a thermally conductive structure disposed in the encapsulant;
    a thermally conductive layer disposed over the semiconductor die; and
    a thermally conductive trace disposed between the thermally conductive structure and the thermally conductive layer, wherein the thermally conductive layer, thermally conductive trace, and thermally conductive structure are electrically isolated from the contact pad of the semiconductor die and the electrically conductive trace.

14. The semiconductor package of claim 13, the thermally conductive structure comprising a conductive through hole via (THV).

15. The semiconductor package of claim 13, further comprising a thermal channel disposed around a portion of the encapsulant.

16. The semiconductor package of claim 15, wherein the thermal channel is disposed around an entirety of the encapsulant.

17. The semiconductor package of claim 16, further comprising a seed layer disposed between the encapsulant and the thermal channel.

18. A semiconductor package, comprising:
    a semiconductor die having a contact pad electrically connected to a circuit within the semiconductor die;
    encapsulant disposed around the semiconductor die;
    a trench etched into the encapsulant around a portion of the semiconductor die;
    a thermally conductive material disposed in the trench to form a thermal channel;
    a thermally conductive pad disposed over the semiconductor die;
    thermally conductive traces interconnecting the thermal channel and the thermally conductive pad;
    a conductive via formed in the encapsulant; and
    a signal trace electrically interconnecting the conductive via and the contact pad of the semiconductor die, wherein the thermally conductive pad, thermally conductive traces, and thermal channel are electrically isolated from the contact pad of the semiconductor die.

19. The semiconductor package of claim 18, including:
    broad thermal traces formed over the encapsulant; and
    thermally conductive interconnects formed between the broad thermal traces and the thermally conductive pad.

20. The semiconductor package of claim 19, wherein the thermally conductive interconnects are formed in alternating locations within the semiconductor package.

21. The semiconductor package of claim 18, further comprising a heat sink disposed over the semiconductor die.

22. The semiconductor package of claim 18, further comprising a thermal channel disposed around a portion of the encapsulant.

* * * * *